(12) United States Patent
Ren et al.

(10) Patent No.: US 9,000,394 B2
(45) Date of Patent: *Apr. 7, 2015

(54) MULTI-AXIS MAGNETIC LENS FOR FOCUSING A PLURALITY OF CHARGED PARTICLE BEAMS

(75) Inventors: Weiming Ren, San Jose, CA (US); Zhongwei Chen, San Jose, CA (US)

(73) Assignee: Hermes Microvision, Inc., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 13/464,261

(22) Filed: May 4, 2012

(65) Prior Publication Data

US 2013/0153782 A1 Jun. 20, 2013

Related U.S. Application Data

(60) Provisional application No. 61/577,888, filed on Dec. 20, 2011.

(51) Int. Cl.
*H01J 37/14* (2006.01)
(52) U.S. Cl.
CPC ......... *H01J 37/14* (2013.01); *H01J 2237/1415* (2013.01)
(58) Field of Classification Search
USPC .................................................. 250/396 ML
See application file for complete search history.

(56) References Cited

U.S. PATENT DOCUMENTS

| 3,715,580 A | 2/1973 | Saitou et al. |
| 6,750,455 B2 | 6/2004 | Lo et al. |
| 8,003,953 B2 | 8/2011 | Chen et al. |
| 2006/0163488 A1* | 7/2006 | Lanio ................ 250/396 ML |
| 2007/0097560 A1* | 5/2007 | Karr et al. .................. 360/324.2 |
| 2011/0227682 A1* | 9/2011 | MacLennan ................... 336/57 |

OTHER PUBLICATIONS

U.S. Appl. No. 12/968,221, filed Dec. 14, 2010, Chen et,al.
U.S. Appl. No. 12/968,201, filed Dec. 14, 2010, Chen et, al.

* cited by examiner

*Primary Examiner* — Jack Berman
*Assistant Examiner* — Eliza Osenbaugh-Stewart
(74) *Attorney, Agent, or Firm* — WPAT, PC; Justin King

(57) ABSTRACT

The present invention provides two ways to form a special permeability-discontinuity unit inside every sub-lens of a multi-axis magnetic lens, which either has a simpler configuration or has more flexibility in manufacturing such as material selection and mechanical structure. Accordingly several types of multi-axis magnetic lens are proposed for various applications. One type is for general application such as a multi-axis magnetic condenser lens or a multi-axis magnetic transfer lens, another type is a multi-axis magnetic non-immersion objective which can require a lower magnetomotive force, and one more type is a multi-axis magnetic immersion objective lens which can generate smaller aberrations. Due to using permeability-discontinuity units, every multi-axis magnetic lens in this invention can also be electrically excited to function as a multi-axis electromagnetic compound lens so as to further reduce aberrations thereof and/or realize electron beam retarding for low-voltage irradiation on specimen.

25 Claims, 19 Drawing Sheets

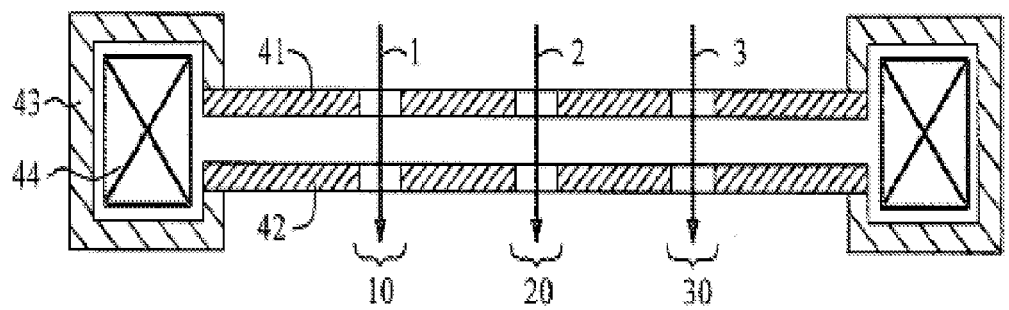
Figure 1A(PIROR ART)
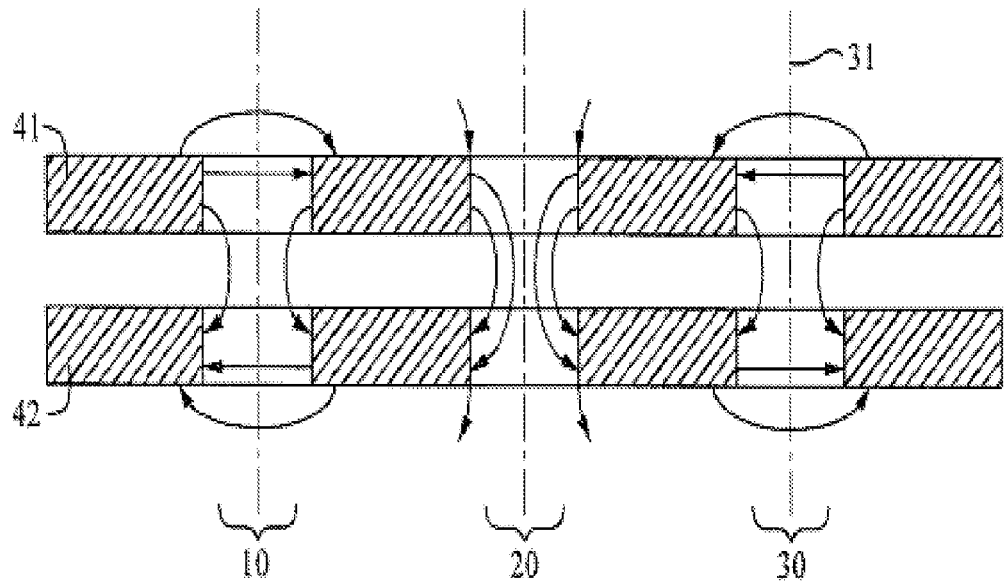
Figure 1B(PIROR ART)

Side View of D-D Section

Side View of D-D Section u14 = u24 = u34 u14 = u34 < u24

MULTI-AXIS MAGNETIC LENS FOR FOCUSING A PLURALITY OF CHARGED PARTICLE BEAMS

CLAIM OF PRIORITY

This application claims the benefit of priority of U.S. provisional application No. 61/577,888 entitled to Weiming et al. filed Dec. 20, 2011 and entitled "Multi-axis Magnetic Lens for Focusing a Plurality of Charged Particle Beams", the entire disclosures of which are incorporated herein by reference.

CROSS REFERENCE TO RELATED APPLICATIONS

This application is related to co-pending U.S. application Ser. No. 12/968,221 entitled to Chen et al. filed Dec. 14, 2010 and entitled "APPARATUS OF PLURAL CHARGED PARTICLE BEAMS WITH MULTI-AXIS MAGNETIC LENS", the entire disclosures of which are incorporated herein by reference.

This application is also related to co-pending U.S. application Ser. No. 12/968,201 entitled to Chen et al. filed Dec. 14, 2010 and entitled "APPARATUS OF PLURAL CHARGED PARTICLE BEAMS WITH MULTI-AXIS MAGNETIC LENS", the entire disclosures of which are incorporated herein by reference.

BACKGROUND OF THE INVENTION

1. Field of the Invention

The present invention relates to a multi-axis magnetic lens and variants thereof used for focusing a plurality of charged particle beams individually and in parallel. More particularly, it relates to a multi-axis magnetic lens acting as an objective lens or a condenser lens or a transfer lens in a multi-beam apparatus which uses a plurality of electron beams to in parallel expose patterns onto or inspect defects on a wafer or mask in semiconductor manufacturing industry. Compared with a conventional single-beam counterpart of the multi-beam apparatus, it can obtain a much higher throughput without degrading spatial resolution.

2. Description of the Prior Art

In semiconductor manufacturing industry, an electron beam has been used to expose patterns onto or inspect defects on a wafer or a mask when critical feature dimensions of patterns or defects are beyond the competent ability of a photon beam. The reason is that an electron beam can offer superior spatial resolution compared to a photon beam due to its short wavelength. However, such a superior spatial resolution will be fundamentally deteriorated by electron interaction or called as Coulomb Effect as the electron beam current is increased to obtain a throughput competent for mass production.

To mitigate the limitation on throughput, instead of using one electron beam with a large current, it is proposed many years ago to use a plurality of electron beams each with a small current to expose patterns onto a wafer in parallel, such as U.S. Pat. No. 3,715,580. For structuring a multi-beam apparatus using a plurality of electron beams, one critical problem is how to separately focus multiple electron beams individually and in parallel. Configuring multiple conventional single-beam columns (MSCs) into one multi-beam apparatus was a first solution naturally thought out. Because the spatial interval between every two adjacent beams must be large enough to physically accommodate two single-beam columns in parallel, the number of electron beams available for a wafer or a mask is not sufficient for mass production. As an alternate to using the MSCs, configuring a multi-axis lens to individually focus multiple electron beams in parallel is a promising way to be able to use more electron beams. Compared with the structure of the MSCs, a multi-axis lens will reduce the beam interval by 50%, thereby almost doubling the apparatus throughput.

In U.S. Pat. No. 3,715,580, Maekawa et al. propose a multi-axis magnetic lens for throughput improvement of an IC pattern exposure system. The multi-axis magnetic lens is schematically shown in FIG. 1A, which comprises a common excitation coil 44, one yoke 43 and two magnetic conductor plates 41 and 42 with a plurality of through round holes in pairs. When an electric current is exerted into the coil 44, a magnetic round-lens field will be generated between each pair of coaxial holes respectively in the plates 41 and 42. By this means, multiple magnetic sub-lenses are therefore formed, such as 10, 20 and 30. Each magnetic sub-lens has an optical axis coincident with the coincident central axes of two coaxial holes (such as 31 in FIG. 1B), and can focus an electron beam (such as 1 in sub-lens 10, 2 in sub-lens 20 and 3 in sub-lens 30) entering the sub-lens along the optical axis thereof.

In the foregoing multi-axis magnetic lens, the magnetic flux leakage between each pair of coaxial holes depends on the positions thereof on the plates 41 and 42, geometrical shapes and magnetic permeability of the plates 41 and 42, and the distribution of all the holes on the plates 41 and 42. Hence, the magnetic fields of all the sub-lenses are fundamentally not a pure round-lens field and different from each other in distribution pattern and strength as shown in FIG. 1B. Consequently, there are two inherent issues which hinder all the electron beams to obtain superior resolutions similar to that of a conventional single beam focused by a single-axis lens.

The first issue is a non-axisymmetry of the magnetic field in each sub-lens. The magnetic field distribution of each sub-lens degenerates from axial symmetry to a rotation symmetry and/or n-fold symmetry. In terms of Fourier analysis, the magnetic field comprises not only an axisymmetric component or called as round-lens field, but also a lot of non-axisymmetric transverse field components or called as high order harmonics, such as dipole field and quadrupole field. Only the round-lens field is necessary for focusing an electron beam, and the other components are undesired due to their impairment on beam focusing. The dipole field deflects the charged particle beam, thereby making the beam land on the image plane with position error, additional tilt angle and deflection aberrations, while the quadrupole field adds astigmatism to the beam focusing. To compensate the influence of each high order harmonic, at least one additional element generating the same type field is required for each electron beam.

The second issue is the focusing power differences among all the sub-lenses if all the through round holes are same in geometry. The round-lens fields of all the sub-lenses are not equal to each other due to the differences in magnetic flux leakage. The sub-lens closer to the geometrical center of the plates 41 and 42 has a weaker round-lens field. For instance, compared with the sub-lenses 10 and 30, the sub-lens 20 has a weaker round-lens field. Due to the round-lens field differences, the beams 1, 2 and 3 respectively passing through the sub-lens 10, 20 and 30 are focused onto different image planes, not a same image plane.

Many scientists propose methods to fundamentally mitigate or even eliminate the two issues per se. Lo et al. in U.S. Pat. No. 6,750,455 uses a plurality of dummy holes to improve the local structure symmetry of each sub-lens. However this method makes the multi-axis magnetic lens system bulky. Chen et al. in U.S. Pat. No. 8,003,953 forms a permeability-discontinuity (simply expressed as PD hereafter) unit inside each hole of every sub-lens to eliminate non-axisymmetric transverse field components inside every sub-lens and the focusing power difference among all the sub-lenses. For the sake of clarity, the foregoing unit is named as the first-type PD unit hereafter. Abstractly speaking, the first-type PD unit comprises non-magnetic and magnetic annular layers in alternate arrangement, i.e. a magnetic annular layer is immediately enclosed by a non-magnetic annular layer and/or immediately encloses a non-magnetic annular layer. Inside every hole where a first-type PD unit is formed, the outermost layer adjoins the inner sidewall of the hole, and the innermost layer is a magnetic annular layer and becomes a pole-piece of the sub-lens formed by the hole. Concretely speaking, one or more magnetic rings with high permeability are inserted into each hole of every sub-lens and separated by a non-magnetic radial gap from each other so as to form multiple coaxial layers. From the inner sidewall of the hole to the innermost layer of the unit (i.e. the innermost magnetic ring), permeability at least alternately decreases and increases spatially one time. The innermost magnetic ring is the pole-piece of the sub-lens formed by the hole. FIG. 2A exemplifies a simple embodiment of the first-type PD unit, which takes the sub-lens 30 in FIG. 1A as an example and renames it as 30-1 for the sake of clarity.

In FIG. 2A, two magnetic rings 32 and 33 both having high permeability are respectively inserted into the two coaxial holes in magnetic conductor plates 41 and 42 with two radial gaps G1 and G2. The two gaps G1 and G2 are either a vacuum space or filled with a non-magnetic material. On the one hand, inside the hole of the plate 41, one first-type PD unit is formed by the gap G1 and the magnetic ring 32, and consequently permeability spatially decreases from permeability u41 of the magnetic conductor plate 41 to 1 and then increases to permeability u32 of the magnetic ring 32. On the other hand, inside the hole of the plate 42, one first-type PD unit is formed by the gape G2 and the magnetic ring 33, and consequently permeability spatially decreases from permeability u42 of the magnetic conductor plate 42 to 1 and then increases to permeability u33 of the magnetic ring 33. The magnetic rings 32 and 33 therefore constitute two pole-pieces of the sub-lens 30-1. A magnetic field along the optical axis 31 is generated through the non-magnetic gap between these two pole-pieces 32 and 33. The upper pole-piece 32 is extended into the inner hole 33h of the lower pole-piece 33 to eliminate the non-axisymmetric transverse field components in the gap. The thicknesses of gaps G1 and G2 on the one hand have to be small enough to keep a sufficient magnetic coupling for making the round-lens field strong enough, and on the other hand large enough to minimize non-axisymmetric transverse field components to a negligible level inside the inner holes 32h and 33h of the upper and lower pole-pieces 32 and 33 respectively. The non-axisymmetric transverse field components generated outside the sub-lens are reduced by two magnetic tubes 36 and 37. In such a way, the non-axisymmetric transverse field components in the areas inside and outside each sub-lens are reduced to a level much lower than that in FIG. 1A. The round-lens field differences or called as focusing power differences among all the sub-lenses are eliminated by specifically choosing thickness differences of the gap G1 and/pr the gap G2 among all the sub-lenses.

Based on the fundamental of the multi-axis magnetic lens in U.S. Pat. No. 8,003,953, Chen et al. further propose a multi-axis magnetic immersion objective in the cross-reference, which comprises a plurality of immersion objective sub-lenses so that a plurality of charged particle beams can be individually and in parallel focused onto a specimen surface with small aberrations. One embodiment is shown in FIG. 2B, which also takes the sub-lens 30 in FIG. 1A as an example and renames it as 30-2 for the sake of clarity. Two magnetic shielding plates 50 and 51 with a plurality of through round openings sandwich the magnetic conductor plates 41 and 42 with two axial gaps G11 and G12. The magnetic rings 32 and 33 are respectively inserted into a pair of coaxial holes on plates 41 and 42 with two radial gaps G1 and G2 to form two first-type PD units therein and become two pole-pieces of the sub-lens 30-2. The gaps G1 and G2 are either a vacuum space or filled with a non-magnetic material. The lower ends of two pole-pieces 32 and 33 are configured to form a radial gap G3 opposite to the specimen 60 and extended inside the corresponding coaxial hole in the lower magnetic shielding plate 50.

As well known, a new multi-axis magnetic lens is always desired if it is easier in manufacturing and at least not worse in performance than the prior art. Accordingly, increasing simplicity and flexibility of the first-type PD unit in configuration and manufacturing is needed in reducing ease and cost of manufacturing.

SUMMARY OF THE INVENTION

On the basis of the fundamental of U.S. Pat. No. 8,003,953 and the cross-reference, the object of this invention is to provide a multi-axis lens with a structure simpler and requiring fewer limitations for manufacture than the prior art. At first, each sub-lens of the multi-axis magnetic immersion objective lens in the cross-reference is simplified to have only one first-type PD unit rather than two, and then the simplified lens is further configured to be a multi-axis electromagnetic compound immersion objective lens. Then, a first-type PD unit is modified to be more flexible in selection of manufacturing material and mechanical structure, and the unit after such a modification is named as a second-type PD unit. Accordingly, a plurality of second-type PD units is used to configure several types of multi-axis magnetic or electromagnetic compound lens.

In a first embodiment, a multi-axis magnetic immersion objective lens is disclosed, which comprises a pair of parallel magnetic conductor plates with a plurality of through round holes in pairs therein, a plurality of magnetic rings inside and aligned with the plurality of through round holes with a plurality of pairs of an upper radial gap and a lower radial gap respectively, and a common excitation coil located between the pair of parallel magnetic conductor plates. The pair of parallel magnetic conductor plates includes an upper plate and a lower plate. For each paired through round holes, an upper through round hole in the upper plate is aligned with a corresponding lower through round hole in the lower plate. For each magnetic ring in each paired through round holes, the upper and lower radial gaps are respectively between outer sidewall of said magnetic ring and inner sidewalls of the upper and lower through round holes respectively, thereby forming a plurality of magnetic sub-lens modules for focusing a plurality of charged particle beams respectively. For each sub-lens module, the magnetic ring functions as an upper pole-piece and a portion forming the lower through round hole in the lower plate functions as a lower pole-piece. The common excitation coil is used for providing magnetic flux to the plurality of magnetic sub-lens modules.

A specimen is located below and parallel to the lower magnetic conductor plate. For each magnetic sub-lens module, the magnetic ring has high permeability. Moreover, the lower radial gap may be vacuum or filled with non-magnetic material, and the upper radial gap may be vacuum or filled with non-magnetic material or weakly-magnetic material having permeability much smaller than that of both the magnetic ring and the lower magnetic conductor plate. Further, a lower end of the magnetic ring is configured to coincide with or extend below a bottom surface of the lower magnetic conductor plate, and a thickness of the upper radial gap is smaller than a thickness of the lower radial gap and the lower radial gap has a funnel shape with a narrow lower end opposite to an upper surface of the specimen.

The multi-axis magnetic immersion objective lens according to the present invention may further comprise an upper magnetic shielding plate located above the upper magnetic conductor plate and a lower magnetic shielding plate located between the lower magnetic conductor plate and the specimen, wherein the upper and lower magnetic shielding plates have a plurality of circular openings aligned with the plurality of through round holes respectively so as to efficiently reduce non-axisymmetric transverse field components above and below the upper and lower magnetic conductor plates respectively. The multi-axis magnetic immersion objective lens may still comprise a magnetic stage located below the specimen to sustain the specimen thereon, wherein the magnetic stage magnetically couples with the upper and lower pole-pieces of each sub-lens module to create a strong magnetic field immersion on the upper surface of the specimen.

All the magnetic sub-lens modules are configured to have same focusing power by using a specific arrangement of thickness differences and/or permeability differences among the plurality of upper radial gaps. For each magnetic sub-lens module, the magnetic ring and the specimen are electrically excited to act as an electrostatic sub-lens so that every magnetic sub-lens module can become an electromagnetic compound sub-lens module. The multi-axis magnetic immersion objective lens may further comprise a plurality of annular electrodes aligned with the plurality of magnetic rings respectively, wherein for each electromagnetic compound sub-lens model, the electrode is configured between the magnetic ring and the specimen to efficiently control electric field on the upper surface of the specimen. Moreover, the multi-axis magnetic immersion objective lens may comprise an annular multilayer inside every upper radial gap, wherein said annular multilayer comprises weakly-magnetic annular layers and magnetic annular layers in alternate arrangement and an innermost weakly-magnetic annular layer of said annual multilayer adjoins said upper pole-piece. For said annular multilayer, one or more of said weakly-magnetic annular layers may be replaced by a non-magnetic annular layer or vacuum.

In a second embodiment, a multi-axis magnetic lens is disclosed, which comprises a pair of parallel magnetic conductor plates with a plurality of through round holes in pairs therein, a plurality of magnetic rings in pairs inside and aligned with the plurality of through round holes with a plurality of first radial gaps in pairs respectively, and a common excitation coil located between the pair of parallel magnetic conductor plates. The pair of parallel magnetic conductor plates includes an upper plate and a lower plate. For each paired through round holes, an upper through round hole in the upper plate is aligned with a corresponding lower through round hole in the lower plate. For each paired first radial gaps formed by each paired magnetic rings inside each paired through round holes, a first upper radial gap is between an inner sidewall of the upper through round hole and an outer sidewall of the upper magnetic ring, a first lower radial gap is between an inner sidewall of the lower through round hole and an outer sidewall of the lower magnetic ring, and one of said first upper and lower radial gaps is filled with weakly-magnetic material with permeability much smaller than that of the magnetic ring and the magnetic conductor plate. Therefore a plurality of magnetic sub-lens modules is formed for focusing a plurality of charged particle beams respectively, wherein paired upper and lower magnetic rings of each sub-lens module function as upper and lower pole-pieces of said sub-lens respectively. The common excitation coil is used for providing magnetic flux to the plurality of magnetic sub-lens modules.

For said each magnetic sub-lens module, each of the paired magnetic rings has high permeability. Moreover, the other of said each of the paired first radial gaps is vacuum or filled with non-magnetic material or weakly-magnetic material with permeability much smaller than that of the magnetic ring and the magnetic conductor plate. The multi-axis magnetic lens may further comprise an upper magnetic shielding plate located above the upper magnetic conductor plate and a lower magnetic shielding plate located below the lower magnetic conductor plate, wherein the upper and lower magnetic shielding plates have a plurality of circular openings aligned with the plurality of through round holes respectively so as to efficiently reduce non-axisymmetric transverse field components generated above and below the upper and lower magnetic conductor plates respectively. All the magnetic sub-lens modules are configured to have same focusing power by using a specific arrangement of thickness differences and/or permeability differences among the plurality of paired first radial gaps.

For said each magnetic sub-lens module, a lower end of the upper pole-piece can be extended downward through inside an inner hole of the lower pole-piece to form an axial magnetic-circuit gap which is between lower ends of the upper and lower pole-pieces and has a length larger than thicknesses of the paired first radial gaps, so that a magnetic round lens field can be generated through said gap for focusing a charged particle beam. For said each magnetic sub-lens module, an upper end of the lower pole-piece can be extended upward through inside an inner hole of the upper pole-piece to form an axial magnetic-circuit gap which is between upper ends of the upper and lower pole-pieces and has a length larger than thicknesses of the paired first radial gaps, so that a magnetic round lens field can be generated through said gap for focusing a charged particle beam.

A specimen can be located below and parallel to the lower magnetic shielding plate. In such a case, for said each magnetic sub-lens module, a lower end of the upper pole-piece can be extended downward through inside an inner hole of the lower pole-piece to form a radial magnetic-circuit gap which is between lower ends of the upper and lower pole-pieces and has a thickness larger than thicknesses of the paired first radial gaps, so that a magnetic round lens field can be generated through said gap for focusing a charged particle beam onto an upper surface of said specimen with smaller aberrations. For said each magnetic sub-lens module, the upper pole-piece and the specimen can be electrically excited to act as an electrostatic sub-lens so that every magnetic sub-lens module can become an electromagnetic compound sub-lens module. The multi-axis magnetic lens may further comprise a plurality of annular electrodes aligned with the plurality of upper pole-pieces respectively, wherein for said each electromagnetic compound sub-lens model the electrode is configured between the upper pole-piece and the specimen to efficiently control electric field on the upper surface of the specimen.

For said each magnetic sub-lens module, each of the paired magnetic rings has high permeability, and the other of said each of the paired first radial gaps comprises an annular multilayer therein, and said annular multilayer comprises weakly-magnetic annular layers and magnetic annular layers in alternate arrangement and an outermost and an innermost weakly-magnetic annular layers of said annual multilayer respectively adjoin an outer and an inner boundaries of said first radial gap. For said annular multilayer, one or more of said weakly-magnetic annular layers can be replaced by a non-magnetic annular layer or vacuum.

In a third embodiment, a multi-axis magnetic lens is disclosed, which comprises a pair of parallel magnetic conductor plates with a plurality of through round holes in pairs therein, a plurality of magnetic rings in pairs inside and aligned with the plurality of through round holes with a plurality of first radial gaps in pairs respectively, and a common excitation coil located between the pair of parallel magnetic conductor plates. The pair of parallel magnetic conductor plates includes an upper plate and a lower plate. For each paired through round holes, an upper through round hole in the upper plate is aligned with a corresponding lower through round hole in the lower plate. For each paired first radial gaps formed by each paired magnetic rings inside each paired through round holes, a first upper radial gap is between an inner sidewall of the upper through round hole and an outer sidewall of the upper magnetic ring, a first lower radial gap is between an inner sidewall of the lower through round hole and an outer sidewall of the lower magnetic ring, and one of said first upper and lower radial gaps comprises an first annular multilayer therein. Therefore a plurality of magnetic sub-lens modules is formed for focusing a plurality of charged particle beams respectively, wherein paired upper and lower magnetic rings of each sub-lens module function as upper and lower pole-pieces of said sub-lens respectively. The common excitation coil is used for providing magnetic flux to the plurality of magnetic sub-lens modules.

Said first annular multilayer comprises weakly-magnetic annular layers and magnetic annular layers in alternate arrangement and an outermost and an innermost weakly-magnetic annular layers of said annual multilayer respectively adjoin an outer and an inner boundaries of said first radial gap. For said each magnetic sub-lens module, each of the paired magnetic rings has high permeability, and the other of said each of the paired first radial gaps can be vacuum or filled with non-magnetic material or comprise a second annular multilayer therein, and said second annular multilayer comprises weakly-magnetic annular layers and magnetic annular layers in alternate arrangement and an outermost and an innermost weakly-magnetic annular layers of said second annual multilayer respectively adjoin an outer and an inner boundaries of said first radial gap. Further, one or more of said weakly-magnetic annular layers of said second annual multilayer can be replaced by a non-magnetic annular layer or vacuum.

For said first annular multilayer, one or more of said weakly-magnetic annular layers can be replaced by a non-magnetic annular layer or vacuum, and the other of said each of the paired first radial gaps also comprises an annular multilayer therein which is same as said first annular multilayer having at least one weakly-magnetic annular layer. Moreover, for said first annular multilayer, one or more but not all of said weakly-magnetic annular layers can be replaced by a non-magnetic annular layer or vacuum, and the other of said each of the paired first radial gap is vacuum or filled with non-magnetic material.

In a fourth embodiment, a permeability-discontinuity unit is disclosed, which comprises at least one weakly-magnetic annular layer and at least one magnetic annular layer, wherein one magnetic annular layer is immediately enclosed by one weakly-magnetic annular layer and/or immediately encloses one weakly-magnetic annular layer, and the innermost annular layer is a magnetic annular layer, wherein permeability of each weakly-magnetic annular layer is much smaller than that of each magnetic annular layer which adjoins said weakly-magnetic annular layer.

Any weakly-magnetic annular layer can be replaced by a non-magnetic annular layer or vacuum space, and can further comprise more than one weakly-magnetic sub-layers, while any magnetic layer can further comprise more than one magnetic sub-layers. Any weakly-magnetic sub-layer of said any weakly-magnetic annular layer can be replaced by a non-magnetic sub-layer.

In a fifth embodiment, a method for decreasing magnetically-coupling inside a hole of a magnetic plate is disclosed, which comprises a step of providing a magnetic ring which is inside said hole, wherein a radial gap is formed between an inner sidewall of said hole and an outer sidewall of said magnetic ring, wherein permeability inside said radial gap is much lower than that of said magnetic plate and said magnetic ring so that a magnetic flux being leaked from and then being coupled into inner sidewall of said hole is reduced.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The present invention will be readily understood by the following detailed description in conjunction with the accompanying drawings, wherein like reference numerals designate like structural elements, and in which:

FIG. 1A is a schematic illustration of a conventional multi-axis magnetic lens.

FIG. 1B is a schematic illustration of magnetic flux lines of the multi-axis magnetic lens shown in FIG. 1A.

DETAILED DESCRIPTION OF EXAMPLE EMBODIMENTS

Figure 2A:
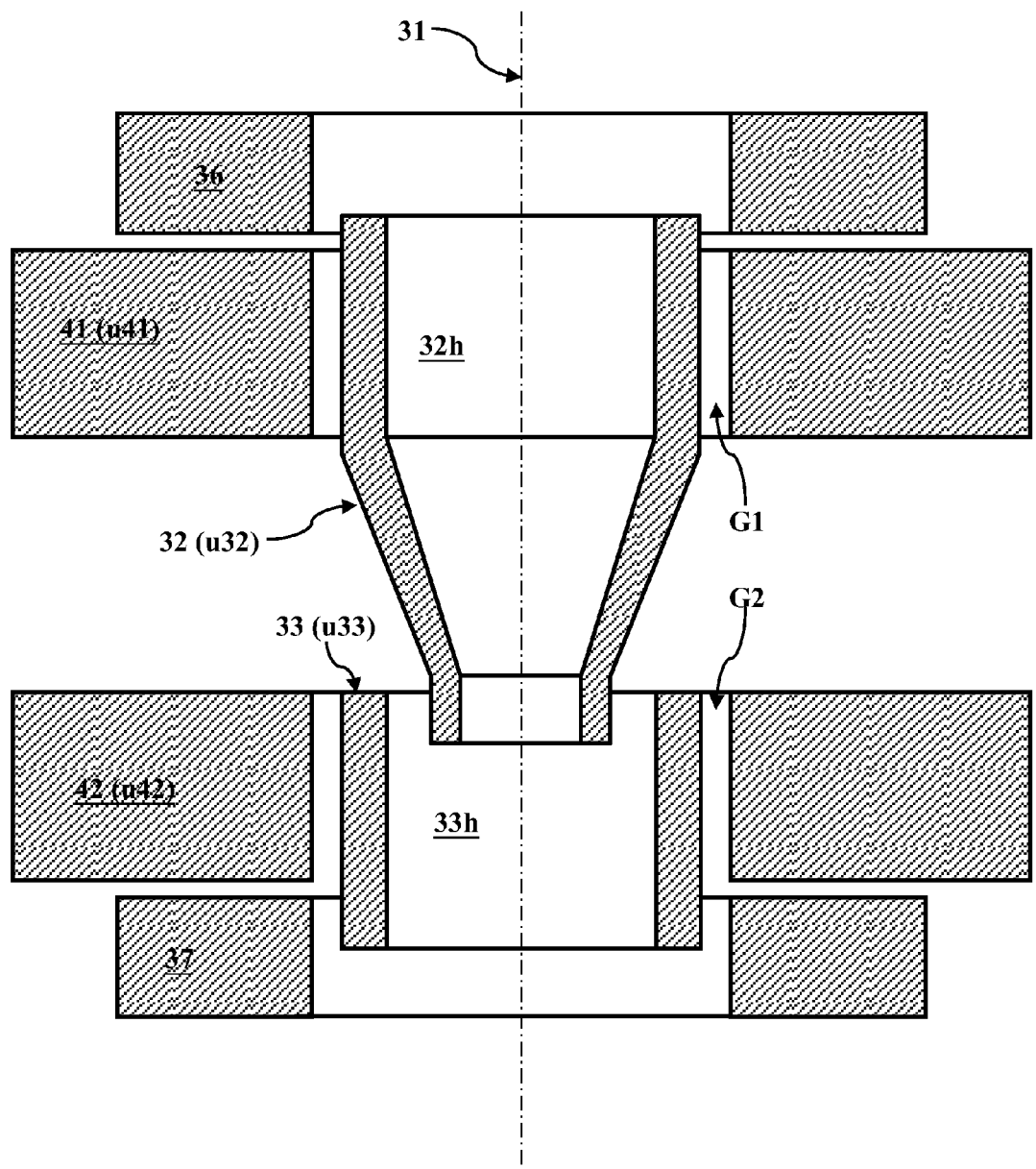
FIG. 2A is a schematic illustration of one magnetic sub-lens with two first-type PD units proposed in the prior art (U.S. Pat. No. 8,003,953).

Various example embodiments of the present invention will now be described more fully with reference to the accompanying drawings in which some example embodiments of the invention are shown. Without limiting the scope of the protection of the present invention, all the description and drawings of the embodiments will exemplarily be referred to an electron beam. However, the embodiments are not be used to limit the present invention to specific charged particles.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention.

In this invention, "axial" means "in the optical axis direction of a sub-lens", while "radial" means "in a direction perpendicular to the optical axis of a sub-lens".

In this invention, every multi-axis magnetic lens has a basic configuration of a conventional multi-axis magnetic lens as shown in FIGS. 1A and 1B. Accordingly, all terms relate to through round holes, circular openings, or circular orifices mean round openings or circular holes penetrated through one plate. Sometimes, especially through round holes always refer to holes in a magnetic conductor plate, circular openings always refer to holes in a magnetic shielding plate, and circular orifices always refer to holes in an electrode plate. For each sub-lens, upper and lower through round holes respectively refer to the through round holes in the upper and lower magnetic conductor plates, and upper and lower pole-pieces respectively refer to the pole-pieces originally belong to the upper and lower holes.

In this invention, "weakly-magnetic and magnetic annular layers in alternate arrangement" means that a magnetic annular layer is immediately enclosed by a weakly-magnetic annular layer and/or immediately encloses a weakly-magnetic annular layer, and permeability of every weakly-magnetic annular layer is much smaller than that of every magnetic annular layer which adjoins it.

A conventional multi-axis magnetic lens, as shown in FIG. 1A, basically comprises one common excitation coil 44, one yoke 43 and two magnetic conductor plates 41 and 42 with a plurality of through round holes respectively for the corresponding charged particle beams passing through. Due to the inherent non-axisymmetric structure of the conventional multi-axis magnetic lens, all the magnetic sub-lenses thereof are not only different from each other in magnetic round-lens field but also generate many non-axisymmetric transverse field components. To make all the sub-lenses function equally and perform as well as an axisymmetric single-axis lens so as to individually and simultaneously focus a plurality of charged particle beams onto a same image plane with high imaging resolution, the foregoing two issues must be solved or eliminated. Accordingly, some additional elements have to be added.

Figure 2B:
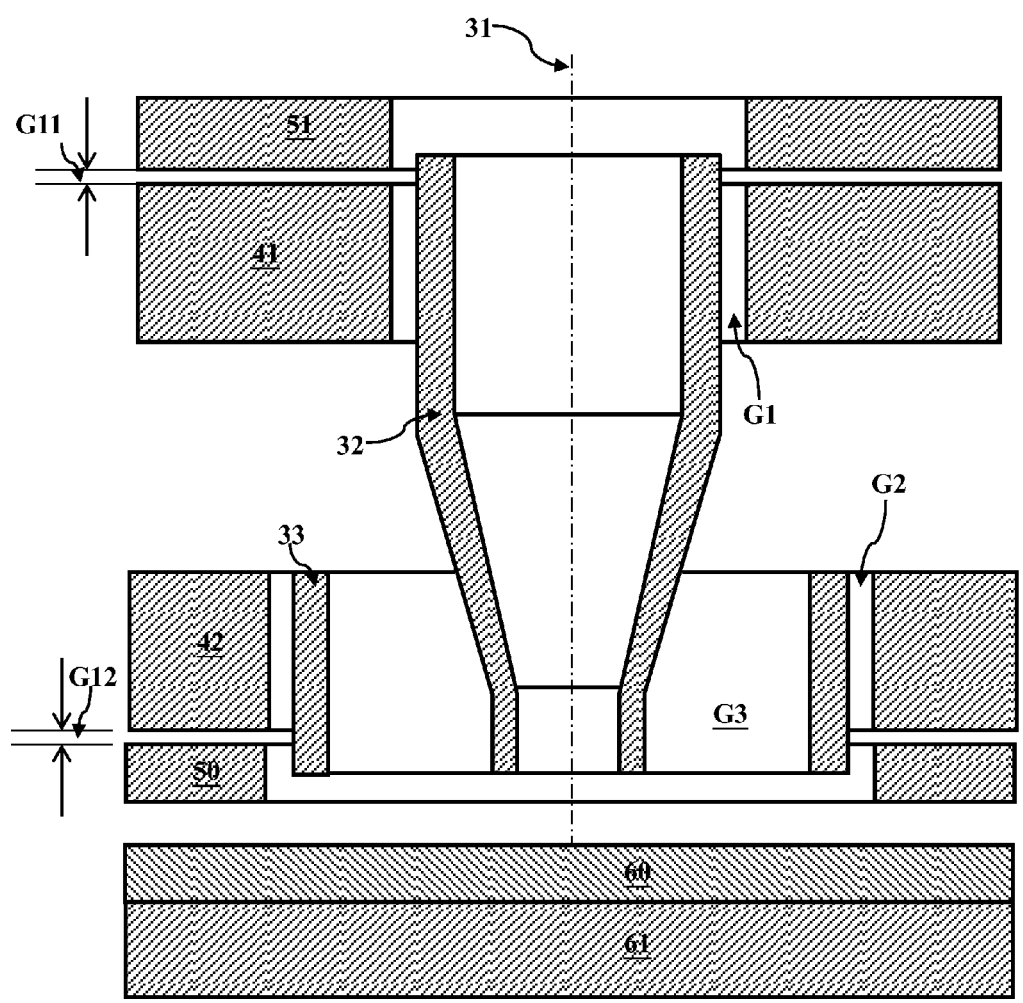
FIG. 2B is a schematic illustration of one magnetic immersion objective sub-lens with two first-type PD units proposed in the cross-reference.

A solution proposed by Chen et al. is to insert one first-type PD unit into each hole of every sub-lens of the foregoing multi-axis magnetic lens to eliminate non-axisymmetric transverse field components inside every sub-lens and the focusing power difference among all the sub-lenses. As shown in FIG. 2A, one simple embodiment of a first-type PD unit comprises one non-magnetic gap and one magnetic ring, such as the magnetic gap G1 and the magnetic ring 32. Furthermore, Chen et al. configure two first-type PD units in each sub-lens to form a multi-axis magnetic immersion objective lens, as shown in FIG. 2B, so as to obtain higher imaging resolution.

Figure 8:
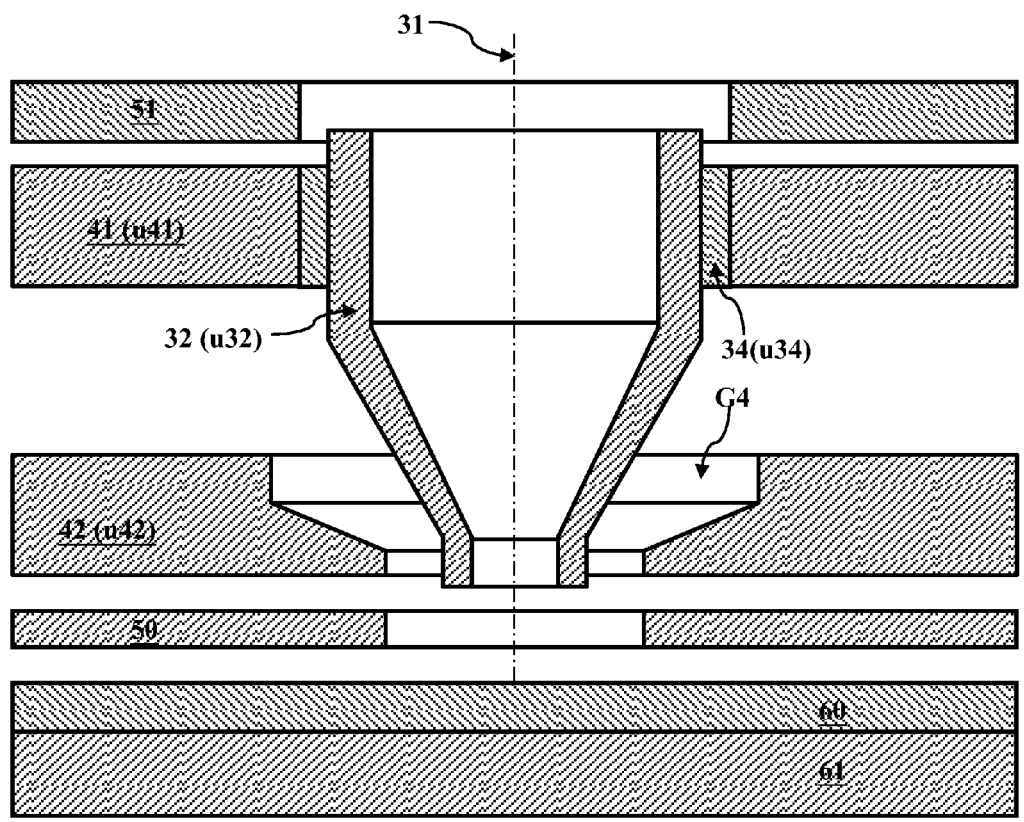
FIG. 8 is a schematic illustration of one magnetic immersion objective sub-lens in a multi-axis magnetic immersion objective lens in accordance with another embodiment of the present invention.
Figure 9:
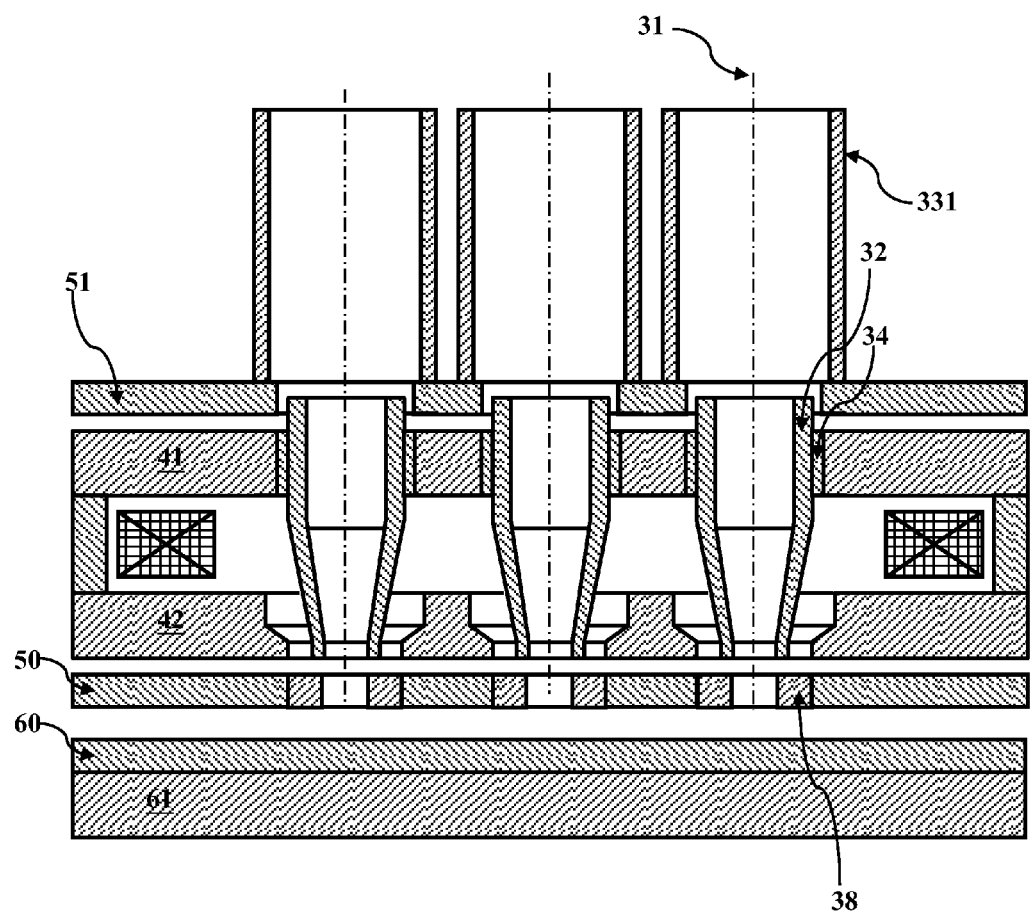
FIG. 9 is a schematic illustration of a multi-axis electromagnetic compound immersion objective lens in accordance with another embodiment of the present invention.
Figure 10A:
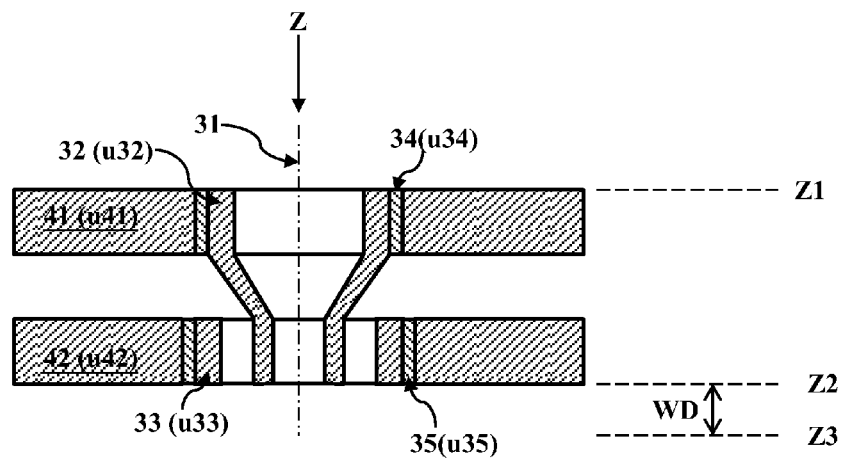
FIG. 10A is a first example schematic illustration of one magnetic objective lens for simulation.
Figure 10B:
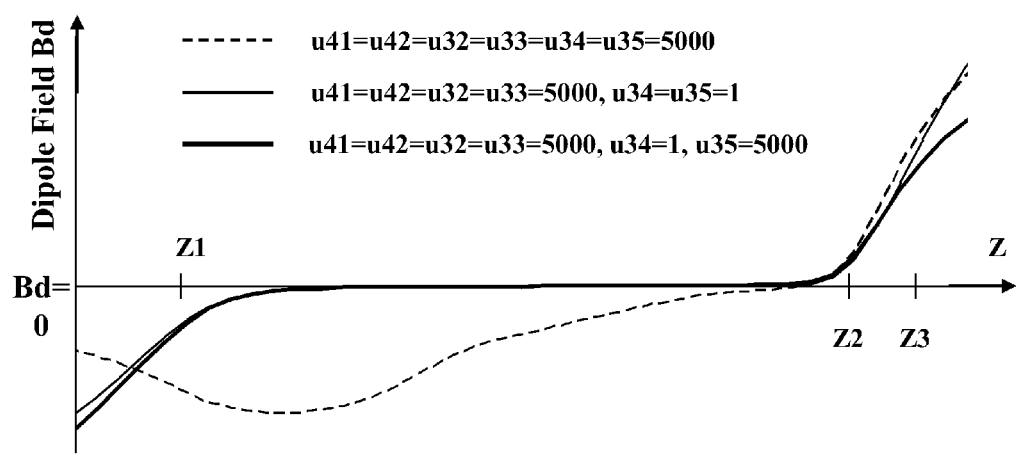
FIG. 10B includes three simulation results by three conditions in accordance with a structure in FIG. 10A.
Figure 11A:
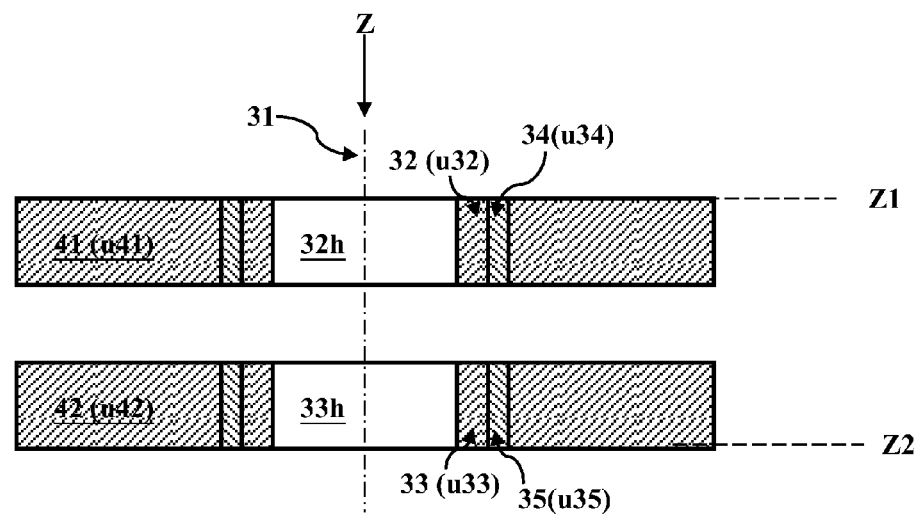
FIG. 11A is a second example schematic illustration of one magnetic objective lens for simulation.
Figure 11B:
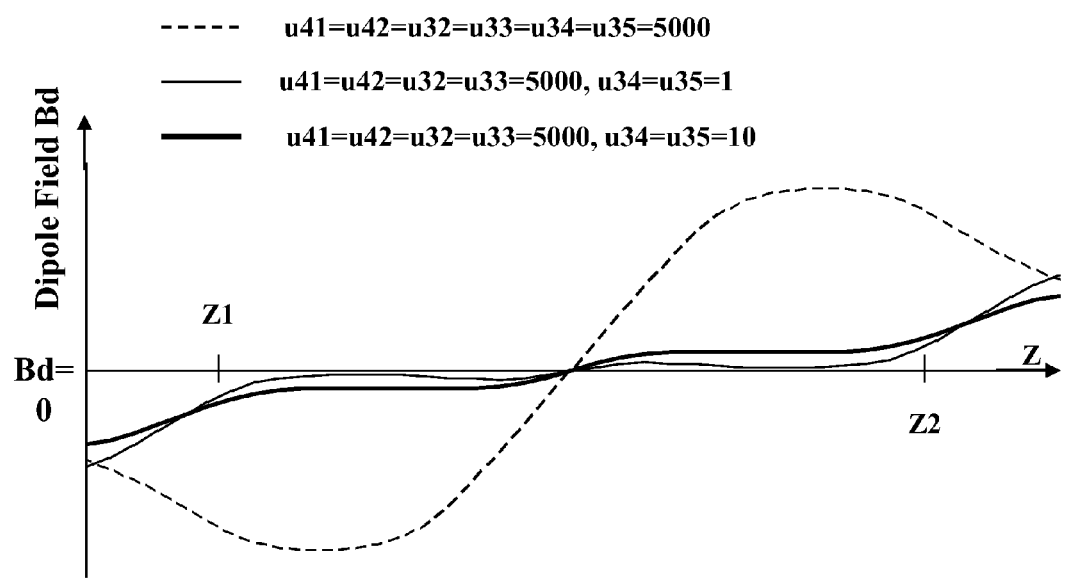
FIG. 11B includes three simulation results by three conditions in accordance with a structure in FIG. 11A.

The present invention further configures the multi-axis magnetic lenses proposed by Chen et al. so as to have a structure simpler and to require fewer limitations for manufacture than before. At first, a multi-axis magnetic immersion objective lens with fewer first-type PD units is provided, which is then used to configure a multi-axis electromagnetic compound immersion objective lens, as respectively shown in FIG. 3A, FIG. 3B and FIG. 4. The performance of the multi-axis magnetic immersion objective lens is simulated and compared with the cross-reference, as shown in FIGS. 10A and 10B. Secondly, a second-type PD unit is proposed and shown in FIGS. 5A~5D and FIGS. 6A~6C, which is more flexible in selection of manufacturing material and mechanical structure. The performances of a first-type PD and a second-type PD are simulated and compared, as shown in FIG. 11A and FIG. 11B. Based on first-type and second-type PD units, a hybrid-type PD unit is provided and shown in FIG. 5E and FIG. 5F. Thirdly a plurality of second-type PD units is used to configure several types of multi-axis magnetic or electromagnetic compound lens, as shown in FIGS. 7A~7D, FIG. 8 and FIG. 9.

The following will describe some embodiments of this invention with referring to the related drawings. Similarly to the foregoing description way, for the sake of clarity, detailed discussions on the embodiment features of the invention are based on a multi-axis magnetic lens comprising three magnetic sub-lenses (one at center, two at periphery) for focusing three electron beams individually, and on the configuration of one peripheral sub-lens. However, it would be recognized that every multi-axis magnetic lens proposed in the present invention has a basic configuration of a conventional multi-axis magnetic lens and certainly comprises a plurality of sub-lenses with same configuration. Although the number of sub-lens is free to increase, it is better to locate every new sub-lens with the least increasing of the geometric structure's asymmetry of the multi-axis magnetic objective lens.

Figure 3A:
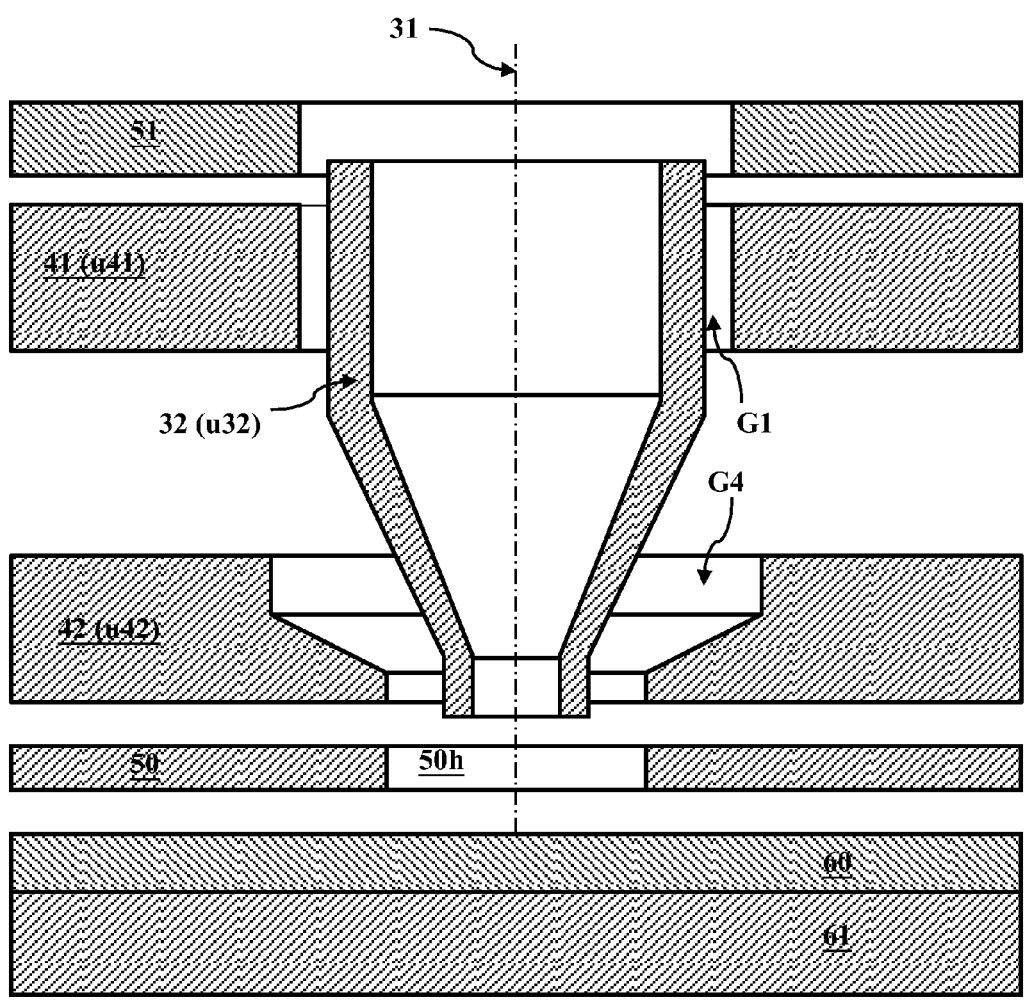
FIG. 3A is a schematic illustration of one magnetic immersion objective sub-lens in a multi-axis magnetic immersion objective lens in accordance with one embodiment of the present invention.

Firstly, a multi-axis magnetic immersion objective lens having one first-type PD unit in each magnetic sub-lens is provided, and one embodiment of a peripheral sub-lens 30-3 is shown in FIG. 3A. For the sub-lens 30-3, the first-type PD unit is configured inside the hole in the upper magnetic conductor plate 41. The magnetic ring 32 with high permeability is inserted into the upper hole with a radial gap G1 to form the first-type PD unit therein. Inside the upper hole, from the inner sidewall thereof to the magnetic ring 32, permeability spatially decreases from permeability u41 of the plate 41 to 1 and then increases to permeability u32 of the magnetic ring 32. The magnetic ring 32 is the upper pole-piece of the sub-lens 30-3, and the portion forming the hole in the lower magnetic conductor plate 42 is the lower pole-piece of the sub-lens 30-3. The lower end of the upper pole-piece 32 is extended into the inner hole of the lower pole-piece to form a radial magnetic-circuit gap G4 which is opposite to the upper surface of the specimen 60. The gaps G1 and G4 are either a vacuum space or filled with a non-magnetic material, and the thickness of the gap G1 is much smaller than the thickness of the gap G4.

In FIG. 3A, a magnetic field along the optical axis 31 and close to the specimen 60 is generated through the lower end of the radial gap G4. Both the first-type PD unit and the radial gap G4 are configured to not only minimize non-axisymmetric transverse field components of the magnetic field to a negligible level but also ensure the round-lens field component of the magnetic field strong enough. To do so, accordingly, the gap G1 must have an appropriate thickness, and the lower end of the pole-piece 32 is preferred to coincide with or extend below the bottom surface of the magnetic conductor plate 42. Moreover, the radial gap G4 is preferred to have a funnel shape whose narrow lower end opposites to the specimen 60. The specimen stage 61 can be magnetic to increase magnetic immersion onto the specimen surface for reducing aberrations. The holes in two magnetic shielding plates 50 and 51 are for electron beam passing through, but their sizes must small enough so as to efficiently reduce the non-axisymmetric transverse field components respectively above and below the upper and lower magnetic conductor plates 41 and 42, and larger enough so as to avoid obvious magnetic coupling with the upper pole-piece 32.

Figure 3B:
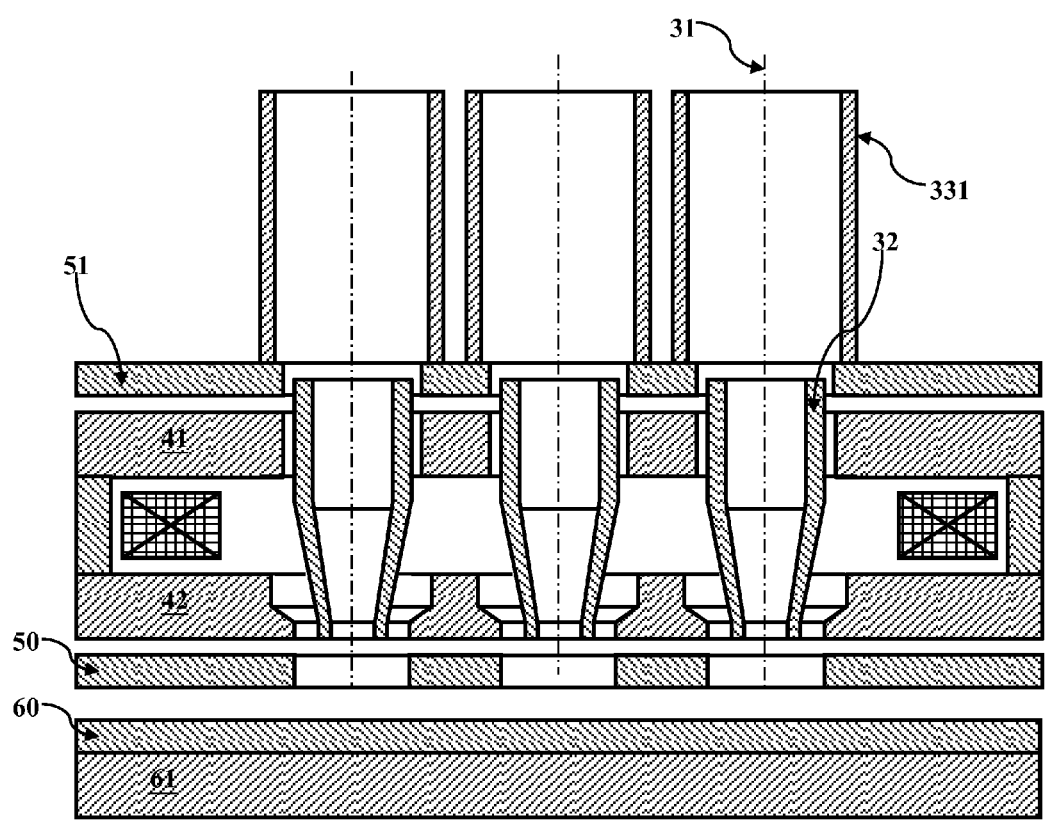
FIG. 3B is a schematic illustration of a multi-axis magnetic immersion objective lens in accordance with the embodiment of the present invention shown in FIG. 3A.

Because the thicknesses of the gaps G1 and G4 influence the magnetic coupling of the upper pole-piece 32 and the magnetic conductor plates 41 and 42 in FIG. 3A, either or both in every sub-lens can be appropriately designed to balance the round lens field difference among all the sub-lenses. FIG. 3B shows a multi-axis magnetic immersion objective lens 100 with three sub-lenses all having configurations same as shown in FIG. 3A. Each of the three magnetic shielding tubes stacked on the upper magnetic shielding plate 51, such as 331, is aligned with the optical axis of the correspondent sub-lens, and used to further reduce the non-axisymmetric transverse field components on the path of the electron beam above the sub-lens.

In addition, the upper pole-piece 32, the magnetic shielding plate 50 and the specimen 60 in FIG. 3A can also be electrically excited to act as an electrostatic sub-lens. Consequently, the magnetic sub-lens 30-3 can be also functioned as an electromagnetic compound sub-lens, thereby enabling the multi-axis magnetic immersion objective lens 100 in FIG. 3B to act as a multi-axis electromagnetic compound immersion objective as well. For the case that the electron beam enters the sub-lens 30-3 with energy higher than the landing energy on the specimen surface, the magnetic ring 32, the magnetic shielding plate 50 and the specimen 60 can be electrically excited to function as an electrostatic retarding sub-lens. In this case, the electron beam begins to decelerate as gradually leaving the magnetic ring 32 and finally to a desired landing energy on the specimen 60. It is known that the higher the electric field on the specimen surface, the smaller the focusing aberrations will be. However, different types of specimen may suffer different electric field strength. Hence, the electric field strength is preferred to be adjustable without changing landing energy. Adjusting the voltage of the magnetic shielding plate 50 can change the electric field all over the specimen surface, but such a change is not obvious at the landing place of the electron beam due to a larger hole 50h in the magnetic shielding plate 50. To avoid a strong magnetic coupling of the upper pole-piece 32 and the magnetic shielding plate 50, the hole 50h cannot be small enough.

Figure 4:
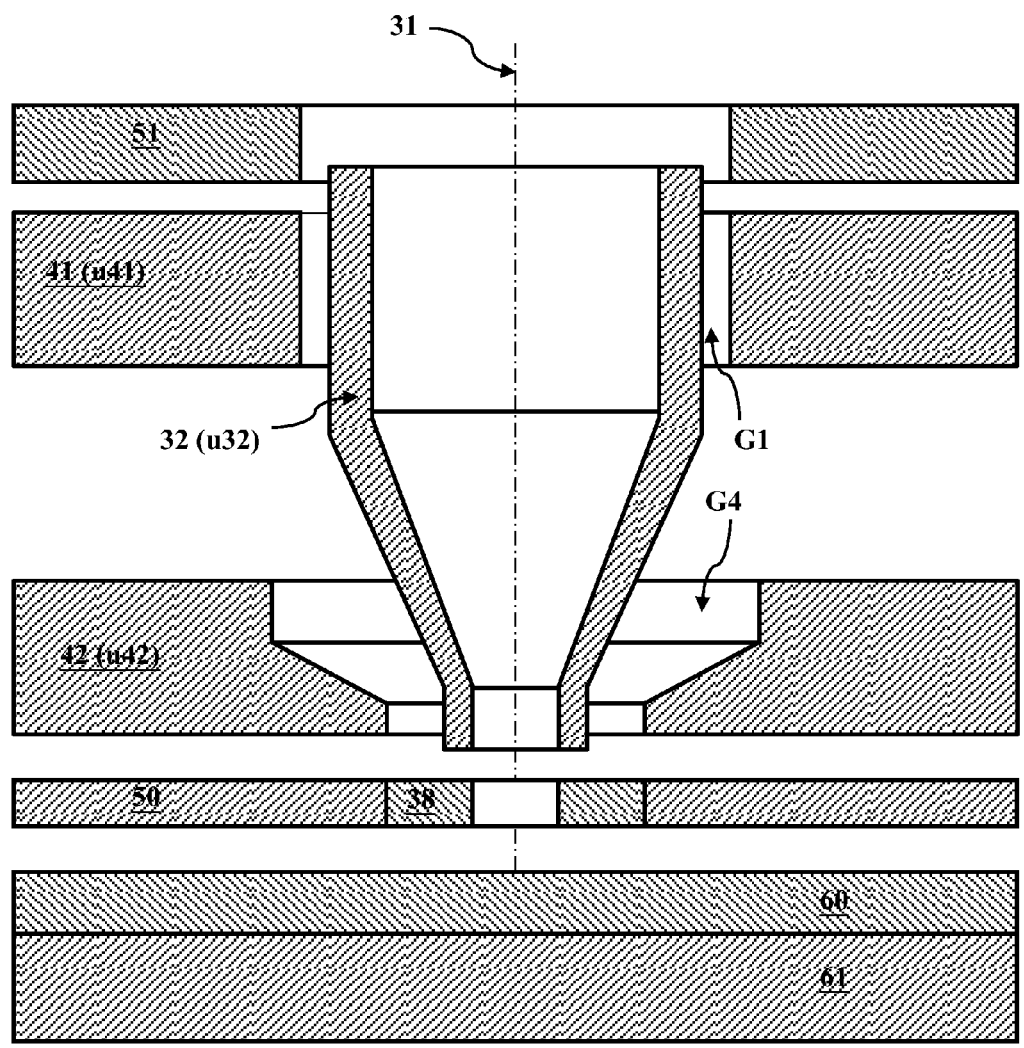
FIG. 4 is a schematic illustration of an electromagnetic compound immersion objective sub-lens in a multi-axis electromagnetic compound immersion objective lens in accordance with another embodiment of the present invention.

This problem can be solved by inserting a non-magnetic annular electrode between the upper pole-piece 32 and the specimen 60, and FIG. 4 shows one embodiment. To get smaller aberrations as much as possible, it is not preferred to additionally increase the distance between the bottom end of the upper pole-piece 32 and the upper surface of the specimen 60. Therefore, the electrode 38 in FIG. 4 is located inside the hole of the magnetic shielding plate 50 and electrically isolated from it. However, the electrode 38 can be below or above the magnetic shielding plate 50. The inner diameter of the annular electrode is appropriately designed so that adjusting the voltage of the electrode 38 can effectively change the electric field on the specimen surface.

The performance of the multi-axis magnetic immersion objective lens shown in FIG. 3A is simulated and compared with the cross-reference by a simplified but fundamental structure model without loss of generality, as shown in FIGS. 10A and 10B. FIG. 10A shows one peripheral magnetic sub-lens model. Compared with FIG. 3A, the two magnetic shielding plates 50 and 51 are not included, the lower hole has a simply cylinder shape, and the gaps G1 and G2 are filled with material 34 and 35. When the permeability u34 and u35 of the material 34 and 35 are equal to the permeability u41 and u42 of the magnetic conductor plates 41 and 42, the model has no first-type PD unit and becomes a conventional case. When permeability u34 and u35 are equal to 1, the model has two first-type PD units and becomes a case proposed in the cross-reference. When the permeability u34 and u35 are equal to 1 and the permeability u42 respectively, the model has one first-type PD unit and becomes a fundamental case shown in FIG. 3A. For the sake of clarity, these three cases are named as Case 1, Case 2 and Case 3 respectively. The optical axis 31 is along the Z-direction. Z1 and Z2 denote positions of the upper and lower surfaces of the magnetic conductor plates 41 and 42 respectively, Z3 denotes the position of the upper surface of a sample, and WD is the distance between Z2 and Z3 and named as working distance.

The three cases are compared by set $u41=u42=5000$, and their dipole field distributions are shown in FIG. 10B by a dash line, a slim line and a bold line respectively. Obviously, it is very efficient that two first-type PD units are used to reduce the dipole field generated inside the multi-axis magnetic sub-lens as mentioned in U.S. Pat. No. 8,003,953. Furthermore, the influence of the lower first-type PD unit in Case 2 is negligible if WD is small enough. Therefore Case 3 works almost as well as Case 2.

Figure 5A:
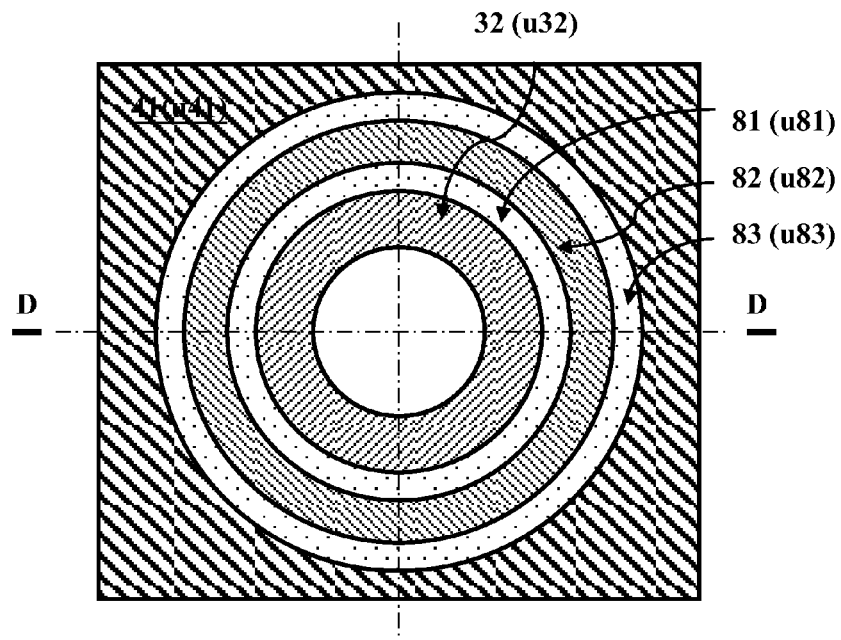
FIGS. 5A-5D are schematic illustrations of a second-type PD unit in accordance with another embodiment of the present invention.
Figure 5B:
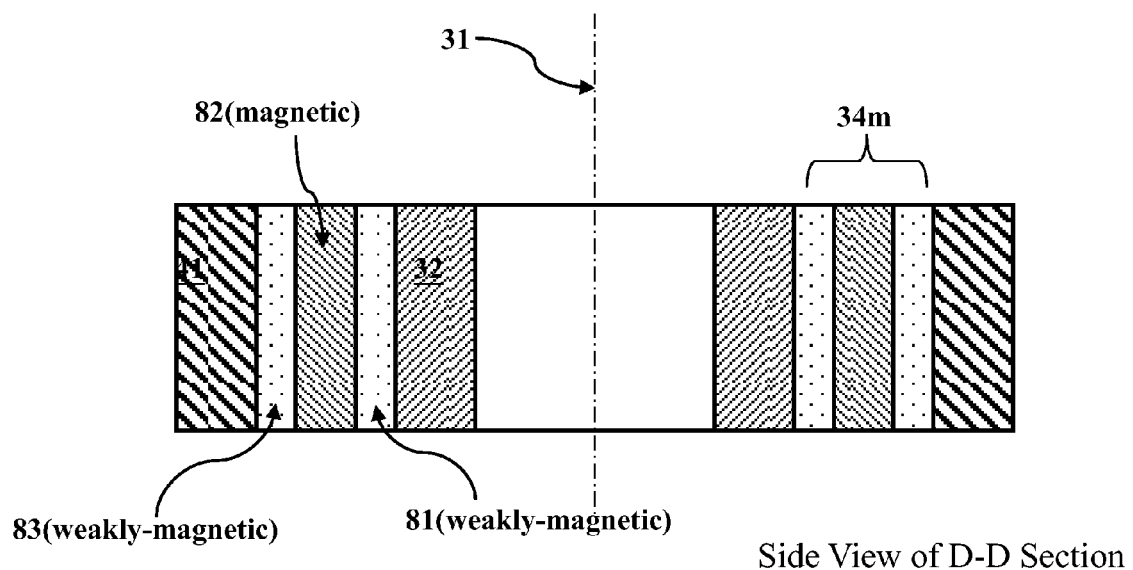

Secondly, a second-type PD unit is proposed, which comprises weakly-magnetic and magnetic annular layers in alternate arrangement. Inside a second-type PD unit, a magnetic annular layer is immediately enclosed by a weakly-magnetic annular layer and/or immediately encloses a weakly-magnetic annular layer. Further, permeability of every weakly-magnetic annular layer is much smaller than that of every adjacent magnetic annular layer, and the innermost layer is a magnetic annular layer. When a second-type PD unit is inserted into a hole of a magnetic plate, the outermost layer adjoins the inner sidewall of the hole and the innermost magnetic layer is one pole-piece originally belonging to the hole. If the outermost layer is a weakly-magnetic layer, permeability thereof is much smaller than that of the magnetic plate. From the inner sidewall of the hole to the innermost layer of the unit (i.e. the pole-piece), permeability at least alternately decreases and increases spatially one time. In addition, the combination of all the layers except the innermost layer (the pole-piece) is called as a multilayer for the sake of clarity. FIG. 5A and FIG. 5B shows one embodiment of a second-type PD unit in a top view and a sectional view respectively. The second-type PD unit is inserted inside a hole in the upper magnetic conductor plate 41 and comprises four annular layers 32, 81, 82, 83. The two magnetic layers 32 and 82 and the two weakly-magnetic layers 81 and 83 are alternately enclosed one by one in radial direction, and the outermost layer 83 neighbors the inner sidewall of the hole. The permeability $u81$ of the weakly-magnetic layer 81 is much smaller than permeability $u32$ and $u82$ of the magnetic layers 32 and 82 respectively, while the permeability $u83$ of the weakly-magnetic layer 83 is much smaller than permeability $u82$ and $u41$ of the magnetic layer 82 and the magnetic conductor plate 41 respectively. The innermost layer 32 is the pole-piece belonging to the hole, and the other layers (81, 82 and 83) together form a multilayer 34m.

Figure 5C:
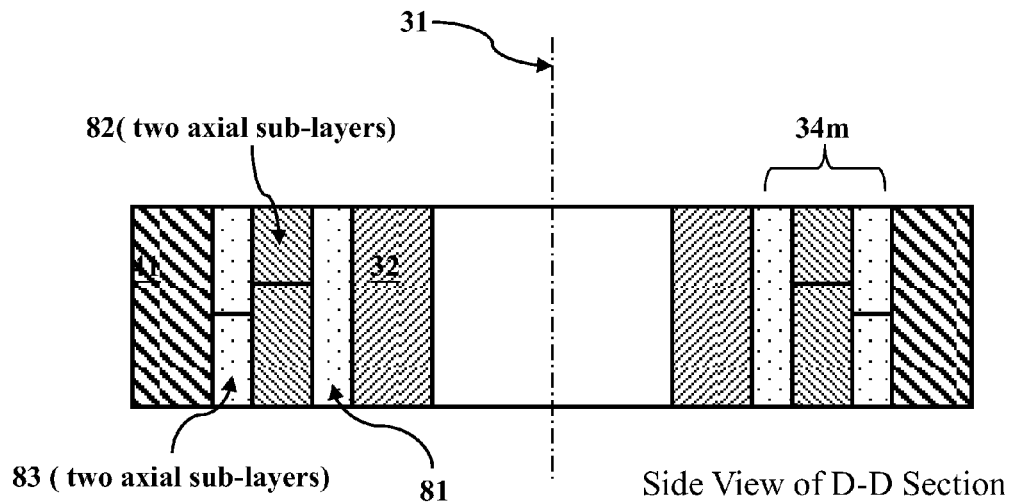
Figure 5D:
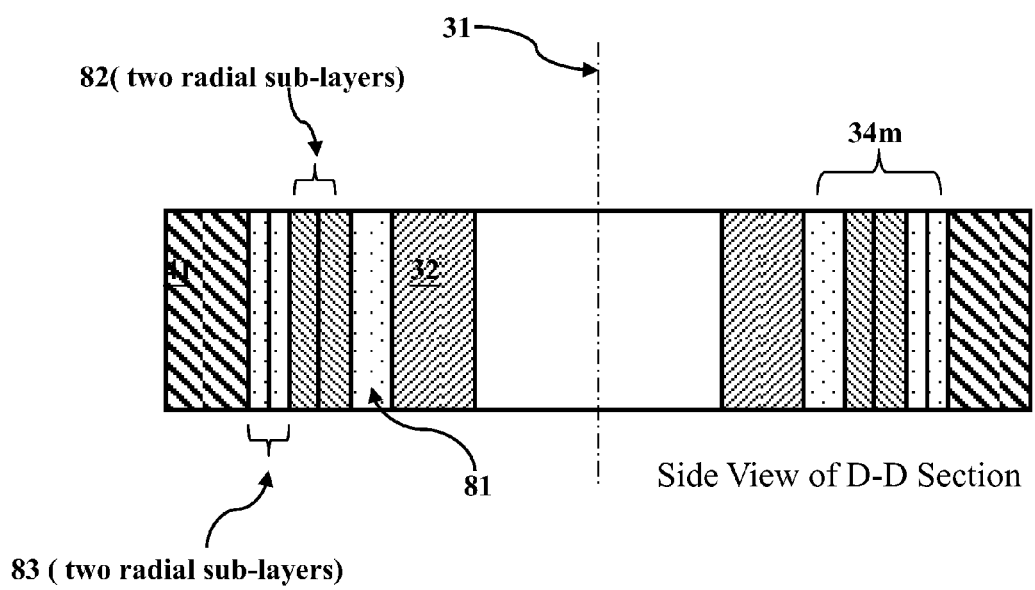

Any layers in a second-type PD unit can further comprise more than one sub-layers of same type. For example, a magnetic layer can comprise two magnetic sub-layers, and a weakly-magnetic layer can comprise three weakly-magnetic sub-layers. Furthermore, sub-layers of a magnetic or weakly-magnetic layer can stack one by one or enclose one by one. In FIG. 5C, the weakly-magnetic layer 83 and magnetic layer 82 comprise two weakly-magnetic sub-layers and two magnetic sub-layers respectively, wherein all the sub-layers stack one by one along the optical axis 31 and thereby being called as axial sub-layers. In FIG. 5D, two weakly-magnetic sub-layers of the weakly-magnetic layer 83 and two magnetic sub-layers of the magnetic layer 82 respectively enclose one by one in every radial direction and thereby being called as radial sub-layers.

Figure 5E:
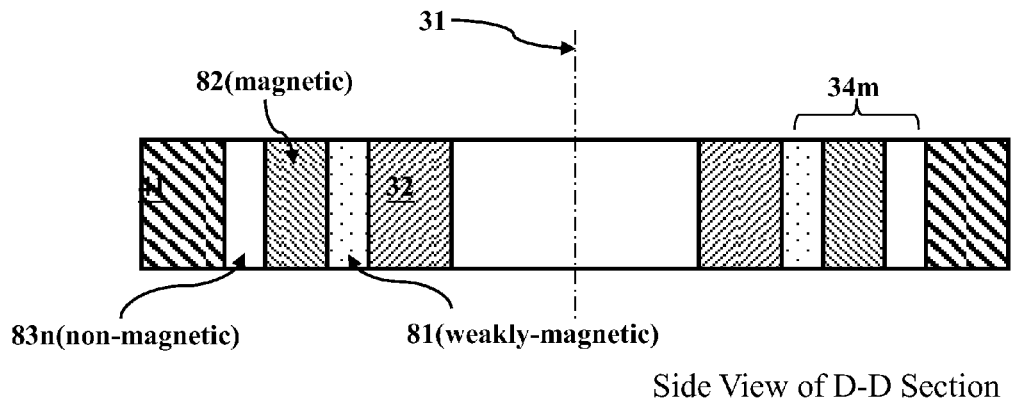
FIG. 5E and FIG. 5F are schematic illustrations of a hybrid-type PD unit in accordance with another embodiment of the present invention.
Figure 5F:
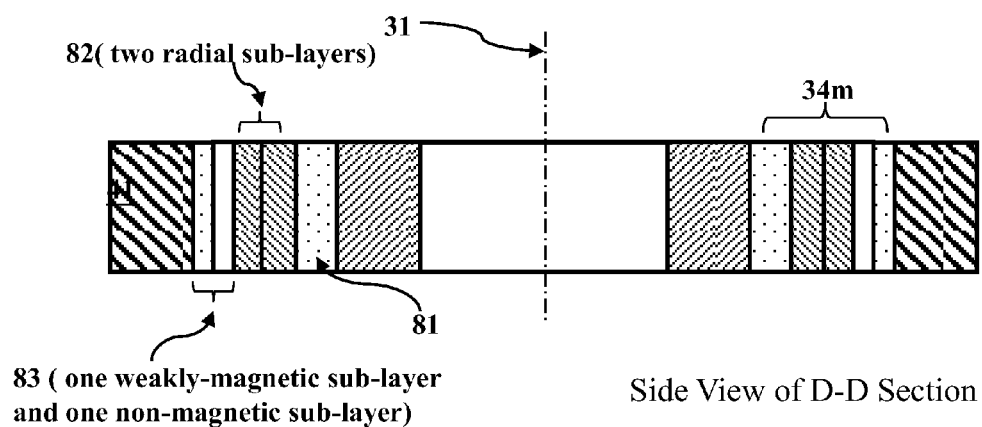

One or more of weakly-magnetic layers in a second-type PD unit can be replaced by a non-magnetic layer. For example, the weakly-magnetic layers 83 in FIG. 5B can be replaced by a non-magnetic layer 83n as shown in FIG. 5E. Furthermore, one or more of weakly-magnetic sub-layers of a weakly-magnetic layer in a second-type PD unit can be replaced by a non-magnetic sub-layer. FIG. 5F shows that one weakly-magnetic sub-layer of the weakly-magnetic layer 83 in FIG. 5D is replaced by a non-magnetic sub-layer. The second-type PD unit after either or both of the foregoing two kinds of replacement is called as a hybrid PD unit.

Figure 6A:
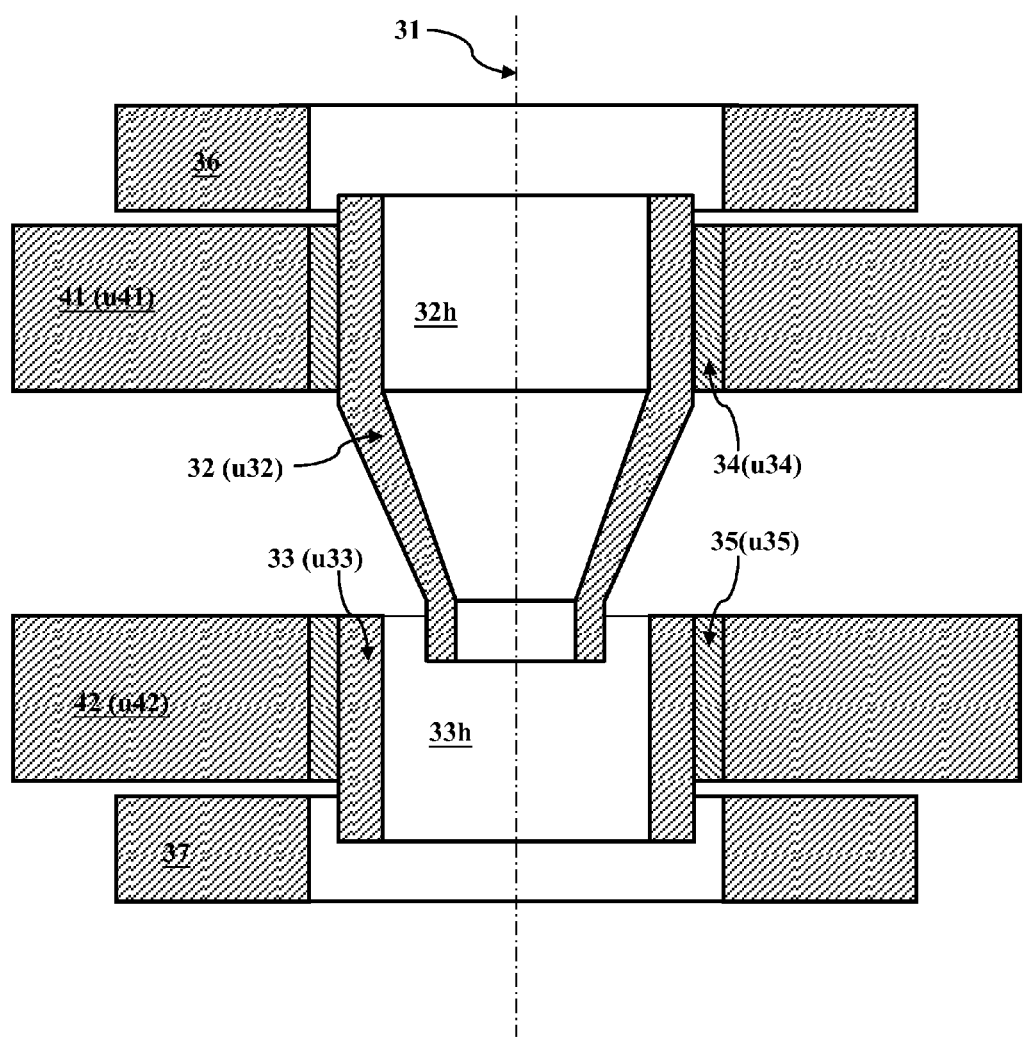
FIG. 6A is a schematic illustration of two second-type PD units in one magnetic sub-lens of a multi-axis magnetic lens in accordance with another embodiment of the present invention.

FIG. 6A shows one simple embodiment of a second-type PD unit, which is inserted inside each hole of the sub-lens 30-1f. For the upper hole in the upper magnetic plate 41, the second-type PD unit comprises the weakly-magnetic ring 34 and the magnetic ring 32, and permeability $u34$ of the weakly-magnetic ring 34 is much smaller than permeability $u32$ of the magnetic ring 32 and permeability $u41$ of the magnetic plate 41. In the same way, the second-type PD unit inside the lower hole in the lower magnetic plate 42 comprises the weakly-magnetic ring 35 and the magnetic ring 33, and permeability $u35$ of the weakly-magnetic ring 35 is much smaller than permeability $u33$ of the magnetic ring 33 and permeability $u42$ of the lower magnetic plate 42. The magnetic rings 32 and 33 are respectively the upper and lower pole-pieces of the sub-lens 30-1f. A magnetic field along the optical axis 31 is generated through the non-magnetic gap between these two pole-pieces 32 and 33. The thicknesses of the weakly-magnetic rings 34 and 35 are small enough to keep a sufficient magnetic coupling for making the round-lens field strong enough, and large enough to minimize non-axisymmetric transverse field components to a negligible level inside the holes 32h and 33h of the upper and lower pole-pieces 32 and 33 respectively. The sub-lens 30-1f in FIG. 6A has a second-type PD unit in each hole; however it can has a second-type PD unit in one hole and a first-type PD unit in the other hole.

The performances of a first-type PD unit and a second-type PD unit are simulated and compared by a simplified but fundamental structure model without loss of generality, as shown in FIGS. 11A and 11B. The one peripheral magnetic sub-lens model is shown in FIG. 11A, which comprise two magnetic conductor plates 41 and 42 and two magnetic rings 32 and 33 respectively inserted inside two holes in the magnetic conductor plates 41 and 42 with two radial gaps. The radial gaps are filled with the material 34 and 35. When the permeability $u34$ and $u35$ of the material 34 and 35 are equal to the permeability $u41$ and $u42$ of the magnetic conductor plates 41 and 42, the model has no PD unit and becomes a conventional case. When permeability $u34$ and $u35$ are equal to 1, the model has two first-type PD units and becomes a case proposed in the U.S. Pat. No. 8,003,953. When the permeability $u34$ and $u35$ are equal to 10, the model has two second-type PD units and becomes a fundamental case shown in FIG. 6A. For the sake of clarity, these three cases are named as Case 4, Case 5 and Case 6 respectively. The optical axis 31 is along the Z-direction. Z1 and Z2 denote positions of the upper and lower surfaces of the magnetic conductor plates 41 and 42 respectively.

The three cases are compared by set $u41=u42=5000$, and their dipole field distributions are shown in FIG. 11B by a dash line, a slim line and a bold line respectively. Obviously, it is very efficient that two first-type PD units are used to reduce the dipole field generated inside the multi-axis magnetic sub-lens as mentioned in U.S. Pat. No. 8,003,953. Furthermore, for each second-type PD unit in Case 3, its function of eliminating dipole field inside the magnetic sub-lens is weakened by its weakly-magnetic layer. However, if the impact is kept down to a negligible or acceptable degree for an application, Case 3 works almost as well as Case 2.

Figure 6B:
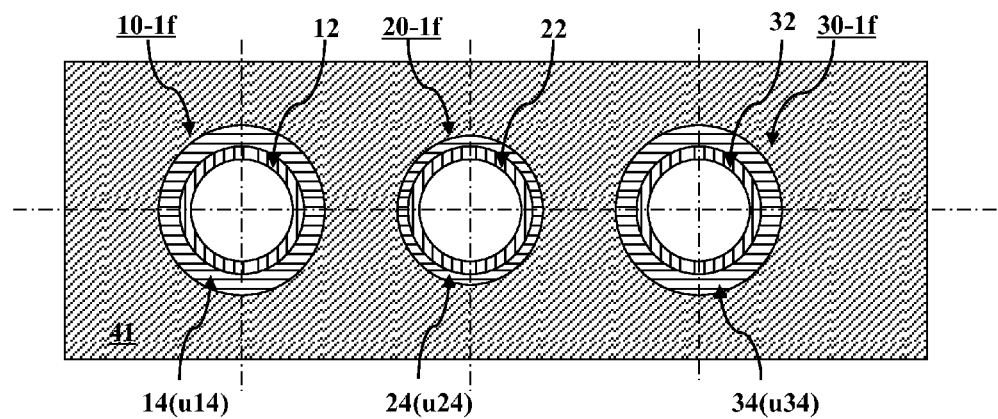
FIG. 6B and FIG. 6C are schematic illustrations of the top views of three sub-lenses in the multi-axis magnetic lens in accordance with the embodiment of the present invention shown in FIG. 6A.
Figure 6C:
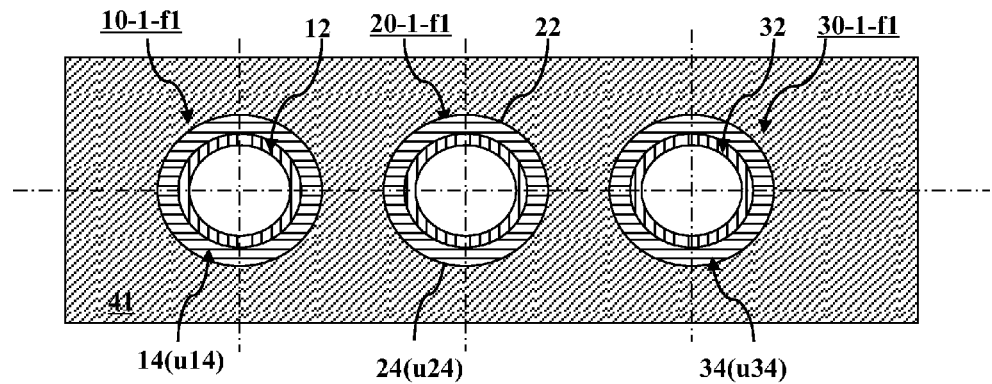

Compared with a first-type PD unit, a second-type PD unit is a little weaker in efficiently eliminating non-axisymmetric transverse field components of a magnetic sub-lens, but provides more flexibility not only in efficiently eliminating focusing power difference among all the sub-lenses but also in manufacturing. Similarly to the way used for first PD unit, FIG. 6B shows one embodiment which uses thickness differences among three weakly-magnetic layers to eliminate focusing power differences among three sub-lenses (10-1*f*, 20-1*f* and 30-1*f*). In FIG. 6B, three weakly-magnetic layers (14, 24 and 34) inside the three holes in the upper magnetic conductor plate 41 are same in permeability (u14, u24 and u34) but different in thickness. The two weakly-magnetic layers 14 and 34 respectively in peripheral sub-lenses 10-1*f* and 30-1*f* have a same thickness which is thicker than that of the weakly-magnetic layer 24 in the center sub-lens 20-1*f*. Besides, FIG. 6C shows another embodiment which uses permeability differences among three weakly-magnetic layers to eliminate focusing power differences among three sub-lenses (10-1*f*, 20-1*f* and 30-1*f*). In FIG. 6C, all the weakly-magnetic layers (14, 24 and 34) are same in thickness but different in permeability (u14, u24 and u34). The two weakly-magnetic layers 14 and 34 respectively in peripheral sub-lenses 10-1*f* and 30-1*f* have an equal permeability which is lower than that of the weakly-magnetic layer 24 in the center sub-lens 20-1*f*. In addition, due to using weakly-magnetic layers instead of non-magnetic layers, a second-type PD unit has a broader variety in material selection and both designing and manufacturing of mechanical structure. In a first-type PD unit, every non-magnetic annular layer is either a vacuum gap or made of a material of non-magnetic conductor. Keeping a vacuum gap raises much difficulty for designing and assembling of the unit, and filling a layer with a perfect non-magnetic material narrows manufacturing material selection.

Figure 7A:
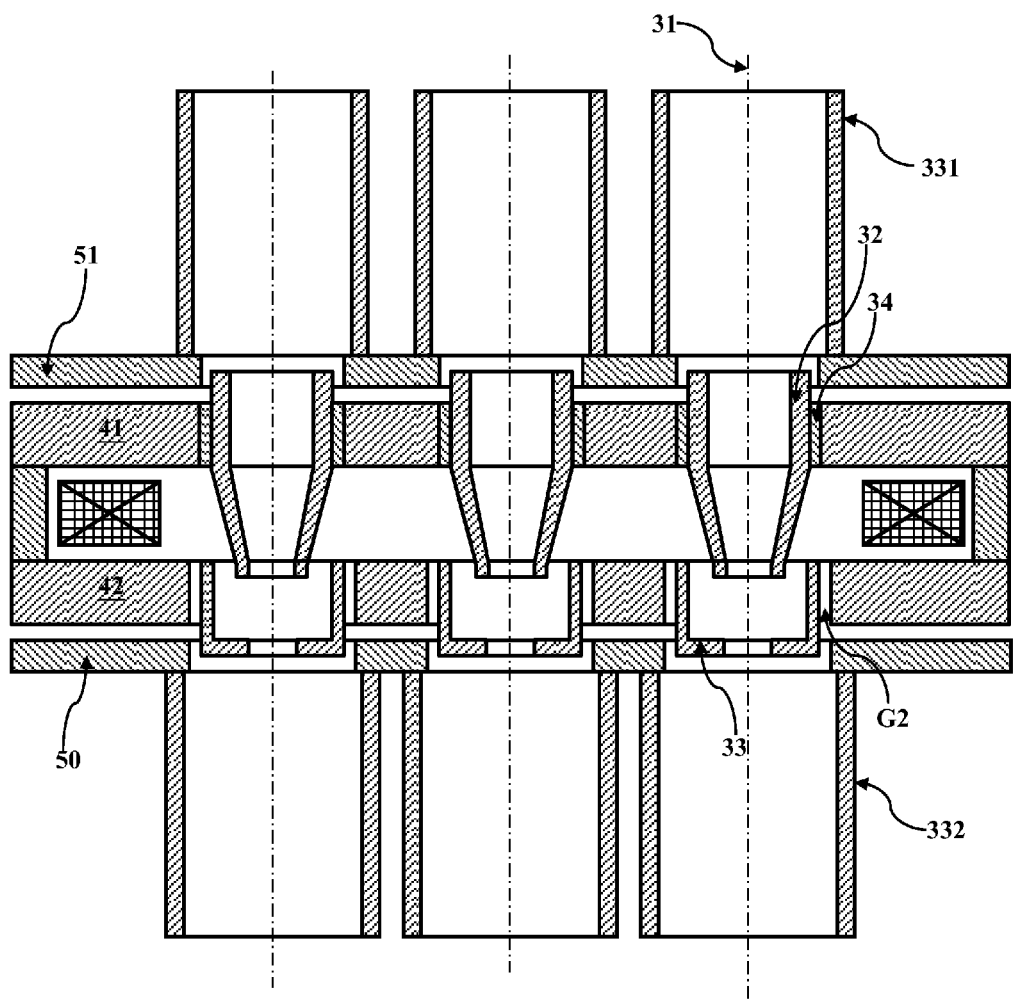
FIG. 7A is a schematic illustration of a multi-axis magnetic lens with a plurality of second-type PD units as shown in FIG. 6A in accordance with another embodiment of the present invention.

Thirdly, a plurality of second-type PD units or both first-type and second-type PD units can be used to configure several types of multi-axis magnetic or electromagnetic compound lens. FIG. 7A shows a multi-axis magnetic lens 200 for general application such as being used as a condenser lens or a transfer lens in a multi-beam apparatus. For each sub-lens in this multi-axis magnetic lens, a second-type PD unit and a first-type PD unit are respectively configured inside the holes in the upper and lower magnetic conductor plates 41 and 42. For instance, for the right sub-lens, the second-type PD unit is formed by the magnetic ring 32 and the weakly-magnetic ring 34, the first-type PD unit is formed by the magnetic ring 33 and the radial non-magnetic gap G2. The magnetic rings 32 and 33 respectively become the upper and lower pole-pieces of the sub-lens, and both are configured to form an axial non-magnetic gap. A magnetic field along the optical axis 31 is generated through the axial non-magnetic gap. To eliminate non-axisymmetric transverse field components of the magnetic field, the axial non-magnetic gap is preferred inside the inner hole of one of the upper and lower pole-pieces 32 and 33. FIG. 7A shows the axial non-magnetic gap inside the inner hole of the lower pole-piece 33, while FIG. 7C shows the axial non-magnetic gap inside the inner hole of the upper pole-piece 32. The non-axisymmetric transverse field components of the magnetic field on the path of the electron beam above and below the sub-lens are eliminated by the upper and lower magnetic tubes 331 and 332 which are aligned with the optical axis 31 of the sub-lens. The round-lens field differences among the three sub-lenses can be eliminated by specifically choosing the thickness differences among the non-magnetic gaps or the weakly-magnetic rings and/or the permeability differences among the weakly-magnetic rings.

Figure 7B:
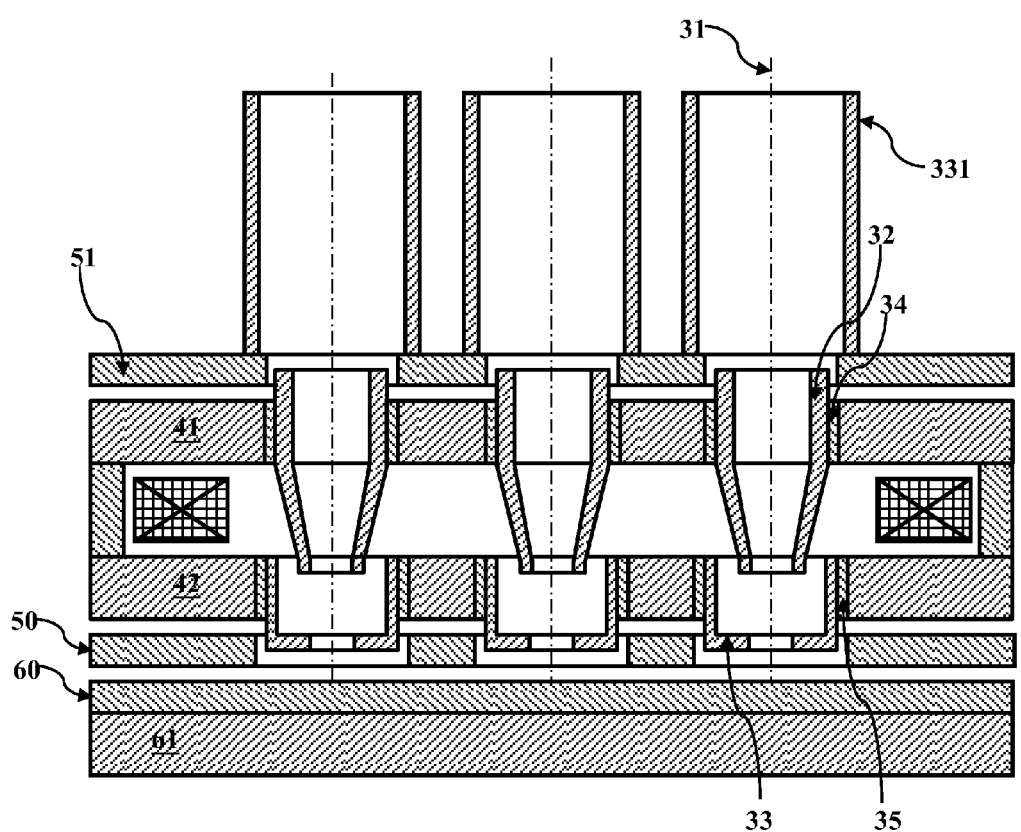
FIG. 7B is a schematic illustration of a multi-axis magnetic non-immersion objective lens with a plurality of second-type PD units as shown in FIG. 6A in accordance with another embodiment of the present invention.
Figure 7C:
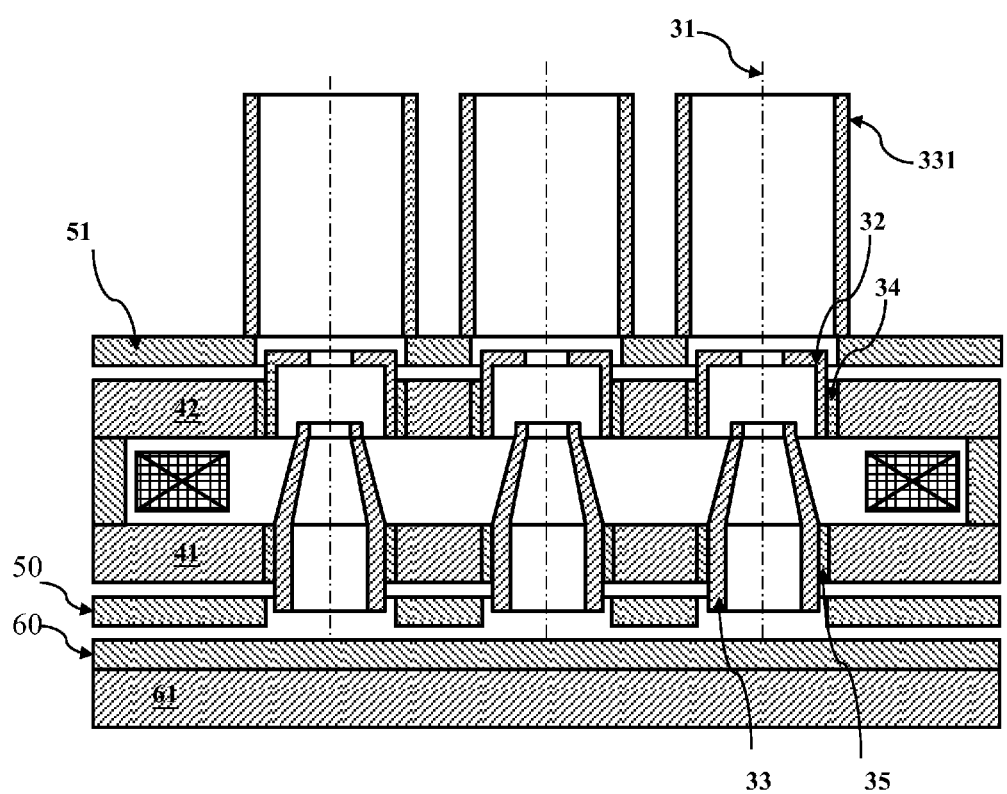
FIG. 7C is a schematic illustration of a multi-axis magnetic non-immersion objective lens with a plurality of second-type PD units as shown in FIG. 6A in accordance with another embodiment of the present invention

FIG. 7B shows a multi-axis magnetic non-immersion objective lens 300-1, which is basically similar to the multi-axis magnetic lens 200 in FIG. 7A but remove all of the lower magnetic shielding tubes thereof and put the specimen 60 under the lower shielding plate 50. For each sub-lens in this multi-axis magnetic lens, two second-type PD units are respectively configured inside the two holes in the upper and lower magnetic conductor plates 41 and 42. For example, for the right sub-lens, the upper second-type PD unit is formed by the magnetic ring 32 and the weakly-magnetic ring 34, the lower second-type PD unit is formed by the magnetic ring 33 and the weakly-magnetic ring 35. The magnetic rings 32 and 33 are the upper and lower pole-pieces of the sub-lens, and both are configured to form an axial non-magnetic gap inside the inner hole of the lower pole-piece 33. A magnetic field along the optical axis 31 is generated through the axial non-magnetic gap. To reduce the imaging aberrations of the sub-lens as much as possible, the axial non-magnetic gap is formed very close to the specimen 60. In addition, the upper and lower pole-pieces in each sub-lens and the specimen 60 can also be electrically excited to act as an electrostatic sub-lens. Consequently, each magnetic sub-lens can be also functioned as an electromagnetic compound sub-lens, and thereby enabling the multi-axis magnetic non-immersion objective lens 300 to act as a multi-axis electromagnetic compound non-immersion objective as well. Furthermore, for the application that the electron beam enters each sub-lens with energy higher than the landing energy on the specimen surface, the upper and lower pole-pieces and the specimen 60 can be electrically excited to function as an electrostatic retarding sub-lens. For some applications that a lower magnetomotive force (product of turns and current of the common excitation coil) is most preferred, the axial non-magnetic gap of every sub-lens can be formed a little far away from the specimen 60, or even inside the inner hole of the upper pole-piece 32 such as the multi-axis magnetic non-immersion objective lens 300-2 shown in FIG. 7C.

Figure 7D:
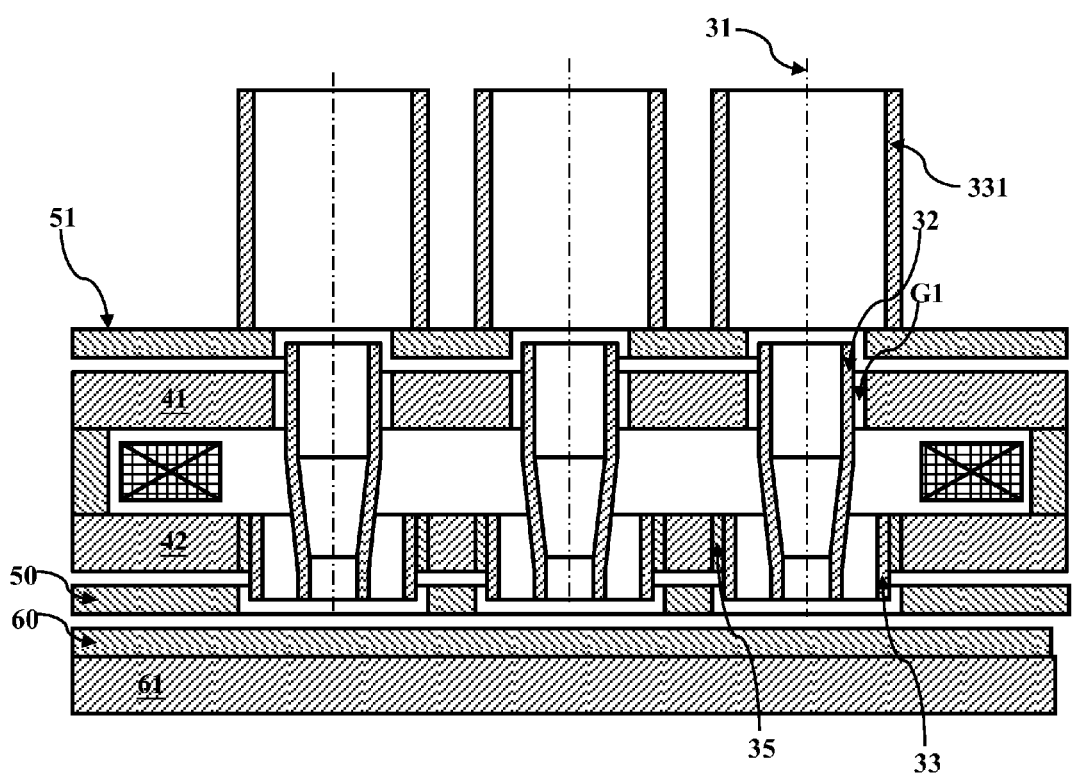
FIG. 7D is a schematic illustration of a multi-axis magnetic immersion objective lens with a plurality of second-type PD units as shown in FIG. 6A in accordance with another embodiment of the present invention.

FIG. 7D shows a multi-axis magnetic immersion objective lens 400. For each sub-lens in this multi-axis magnetic lens, a first-type PD unit and a second-type PD unit are respectively configured inside the holes in the upper and lower magnetic conductor plates 41 and 42. For instance, for the right sub-lens, the first-type PD unit is formed by the magnetic ring 32 and the radial non-magnetic gap G1, the second-type PD unit is formed by the magnetic ring 33 and the weakly-magnetic ring 35. The magnetic rings 32 and 33 respectively are the upper and lower pole-pieces and configured to form a radial non-magnetic gap inside the inner hole of the lower pole-piece 33. To reduce the imaging aberrations of the sub-lens as much as possible, the radial axial non-magnetic gap is formed very close to the specimen 60. A magnetic field along the optical axis 31 is generated through the radial non-magnetic gap and strongly immerses the surface of the specimen 60. In addition, for the application that the electron beam enters each sub-lens with energy higher than the landing energy on the specimen surface, the upper magnetic pole-piece 32 and the specimen 60 can be electrically excited to function as an electrostatic retarding sub-lens. Consequently, each magnetic sub-lens can be also functioned as an electromagnetic compound sub-lens, and thereby enabling the multi-axis magnetic immersion objective lens 400 to act as a multi-axis electromagnetic compound immersion objective as well.

For the multi-axis magnetic immersion objective lens and the multi-axis electromagnetic compound immersion objective lens shown in FIG. 3A, FIG. 3B and FIG. 4, the first-type PD unit in every sub-lens can be replaced by a second-type PD unit. Accordingly, one embodiment of a peripheral sub-lens 30-3*f* is shown in FIG. 8. For the sub-lens 30-3*f*, the second-type PD unit is configured inside the hole in the upper magnetic conductor plate 41 and comprises the magnetic ring 32 and the weakly-magnetic ring 34. The magnetic ring 32 is the upper pole-piece of the sub-lens 30-3*f*, and the portion forming the hole in the lower magnetic conductor plate 42 is the lower pole-piece of the sub-lens 30-3$f$. The lower end of the upper pole-piece 32 is extended into the inner hole of the lower pole-piece to form a radial magnetic-circuit gap G4 which is opposite to the upper surface of the specimen 60. The gap G4 is either a vacuum space or filled with a non-magnetic material, and has a thickness larger than that of the weakly-magnetic ring 34. A magnetic field along the optical axis 31 and close to the specimen 60 is generated through the narrow lower end of the radial gap G4. Similar to the sub-lens 30-3 shown in FIG. 3A, the upper pole-piece 32, the magnetic shielding plate 50 and the specimen 60 in FIG. 8 can also be electrically excited to act as an electrostatic sub-lens. Furthermore, an annular electrode can be inserted between the upper pole-piece 32 and the specimen 60 to efficiently control the electric field on the specimen surface 60. Such a configuration can be used to form a multi-axis electromagnetic compound immersion objective lens, such as 500-ME shown in FIG. 9. In FIG. 9, the annular electrode of every sub-lens, such as the electrode 38 of the right sub-lens, is located inside the hole of the magnetic shielding plate 50 and electrically isolated from it.

In summary this invention provides more types of multi-axis magnetic lens on the basis of fundamental of a first-type PD unit proposed by Chen et al. in U.S. Pat. No. 8,003,953, which have simpler structures and require fewer limitations for manufacture than before. At first, a multi-axis magnetic immersion objective lens using only one first-type PD unit in every sub-lens is provided. Reducing one first-type PD unit in every sub-lens obviously simplifies complexity in mechanical structure, and thereby good for manufacturing. Secondly a new type PD unit, i.e. second-type PD unit, is proposed. Compared with a first-type PD unit, although it is a little weaker in efficiently eliminating non-axisymmetric transverse field components of a magnetic sub-lens, however, if this difference is negligible or acceptable, it provides more flexibility both in efficiently eliminating focusing power difference among all the sub-lenses and in manufacturing such as material selection and mechanical structure. Thirdly a plurality of second-type PD units or a plurality of pairs of a first-type PD unit and a second-type PD unit is used to configure several types of multi-axis magnetic lens. One type is for general application such as a multi-axis magnetic condenser lens or a multi-axis magnetic transfer lens, another type is a multi-axis magnetic non-immersion objective which can require a lower magnetomotive force, and one more type is a multi-axis magnetic immersion objective lens which can generate smaller aberrations. Due to using first-type and/or second-type PD units, every multi-axis magnetic lens in this invention can also be electrically excited to function as a multi-axis electromagnetic compound lens so as to further reduce aberrations thereof and realize electron beam retarding for low-voltage irradiation on specimen.

Although the present invention has been explained in relation to its preferred embodiment, it is to be understood that other modifications and variation can be made without departing the spirit and scope of the invention as hereafter claimed.

What is claimed is:

1. A multi-axis magnetic lens, comprising:
    an upper magnetic conductor plate, comprising:
        a first upper through round hole; and
        a second upper through round hole;
    a lower magnetic conductor plate, planar and parallel to said upper magnetic conductor plate, comprising:
        a first lower through round hole, coaxial with said first upper through round hole; and
        a second lower through round hole, coaxial with said second upper through round hole;
    a first upper magnetic ring positioned inside and coaxial with said first upper through round hole, wherein a first upper radial gap is between said first upper magnetic ring and said upper magnetic conductor plate;
    a first lower magnetic ring, positioned inside and coaxial with said first lower through round hole, wherein a lower radial gap is between said first lower magnetic ring and said lower magnetic conductor plate;
    a second upper magnetic ring, positioned inside and coaxial with said second upper through round hole, wherein a second upper radial gap is between said upper magnetic conductor plate and said second upper magnetic ring;
    a second lower magnetic ring, positioned inside and coaxial with said second lower through round hole, wherein a second lower radial gap is between said lower magnetic conductor plate and said second lower magnetic ring; and
    a common excitation coil, located between said upper magnetic conductor plate and said lower magnetic conductor plate;
    wherein said first upper through round hole, said first upper magnetic ring, said first upper radial gap, said first lower round hole, said first lower magnetic ring and said first lower radial gap function as a first magnetic sub-lens module for focusing a first charged particle beam;
    wherein said second upper through round hole, said second upper magnetic ring, said second upper radial gap, said second lower round hole, said second lower magnetic ring and said second lower radial gap function as a second magnetic sub-lens module for focusing a second charged particle beam;
    wherein said common excitation coil provides magnetic flux to said first magnetic sub-lens module and said second magnetic sub-lens module; and
    wherein one of said first upper radial gap and said first lower radial gap is filled with weakly-magnetic material.

2. The multi-axis magnetic lens according to claim 1, wherein said first upper magnetic ring and said first lower magnetic ring have high magnetic permeability, and said first upper radial gap and said first lower radial gap are filled with weakly-magnetic material.

3. The multi-axis magnetic lens according to claim 2, further comprising:
    an upper magnetic shielding plate, located above said upper magnetic conductor plate, comprising:
        a first upper circular opening, coaxial with said first upper through round hole; and
        a second upper circular opening, coaxial with said second upper through round hole; and
    a lower magnetic shielding plate, located below said lower magnetic conductor plate, comprising:
        a first lower circular opening, coaxial with said first lower through round hole; and
        a second lower circular opening, coaxial with said second lower through round hole;
    wherein said upper and lower magnetic shielding plates efficiently reduce non-axisymmetric transverse field components generated above and below said upper and lower magnetic conductor plates respectively.

4. The multi-axis magnetic lens according to claim 3, wherein said first and said second magnetic sub-lens modules are configured to have same focusing power by using a specific arrangement of permeability differences among said first upper radial gap, said second upper radial gap, said first lower radial gap, and said second lower radial gap.

5. The multi-axis magnetic lens according to claim 4, wherein a lower end of said first upper magnetic ring extends into said first lower magnetic ring to form an axial magnetic-circuit gap between said lower end of said first upper magnetic ring and a lower end of said first lower magnetic ring, wherein said axial magnetic-circuit gap has a length larger than thicknesses of said first upper radial gap and said first lower radial gap, so that a magnetic round lens field can be generated through said axial magnetic-circuit gap for focusing said first charged particle beam.

6. The multi-axis magnetic lens according to claim 4, wherein an upper end of said first lower magnetic ring extends into said first upper magnetic ring to form an axial magnetic-circuit gap between said upper end of said first lower magnetic ring and an upper end of said first upper magnetic ring, wherein said axial magnetic-circuit gap has a length larger than thicknesses of said first lower radial gap and said first upper radial gap, so that a magnetic round lens field can be generated through said axial magnetic-circuit gap for focusing said first charged particle beam.

7. The multi-axis magnetic lens according to claim 4, wherein a specimen is located below and parallel to said lower magnetic shielding plate, a lower end of said first upper magnetic ring extends into said first lower magnetic ring to form a radial magnetic-circuit gap between said lower end of said first upper magnetic ring and a lower end of said first lower magnetic ring, wherein said radial magnetic-circuit gap has a thickness larger than thicknesses of said first upper radial gaps and said first lower radial gap, so that a magnetic round lens field can be generated through said radial magnetic-circuit gap for focusing said first charged particle beam onto an upper surface of said specimen with smaller aberrations.

8. The multi-axis magnetic lens according to claim 7, wherein said first upper magnetic ring and said specimen are electrically excited to act as an electrostatic sub-lens.

9. The multi-axis magnetic lens according to claim 8, further comprising a first annular electrode coaxial with said first upper magnetic ring, wherein said first annular electrode is disposed between said first upper magnetic ring and said specimen to form an electrostatic sub-lens module with said first upper magnetic ring and said specimen to efficiently control electric field on said upper surface of said specimen.

10. The multi-axis magnetic lens according to claim 3, wherein said first magnetic sub-lens and said second magnetic sub-lens modules are configured to have same focusing power by arranging thickness differences among said first upper radial gap, said second upper radial gap, said first lower radial gap, and said second lower radial gap.

11. The multi-axis magnetic lens according to claim 1, wherein one of said first upper radial gap and said first lower radial gap comprises an annular multilayer, and said annular multilayer comprises weakly-magnetic annular layers and magnetic annular layers in alternate arrangement.

12. The multi-axis magnetic lens according to claim 11, wherein said annular multilayer further comprises a non-magnetic annular layer or a vacuum layer.

13. A multi-axis magnetic lens, comprising:
an upper magnetic conductor plate, comprising:
a first upper through round hole; and
a second upper through round hole;
a lower magnetic conductor plate, planar and parallel to said upper magnetic conductor plate, comprising:
a first lower through round hole, coaxial with said first upper through round hole; and
a second lower through round hole, coaxial with said second upper through round hole;
a first upper magnetic ring, positioned inside and coaxial with said first upper through round hole, wherein a first upper radial gap is between said upper magnetic conductor plate and said first upper magnetic ring;
a first lower magnetic ring, positioned inside and coaxial with said first lower through round hole, wherein a first lower radial gap is between said lower magnetic conductor plate and said first lower magnetic ring;
a second upper magnetic ring, inside and coaxial with said second upper through round hole;
a second upper radial gap, between said upper magnetic conductor plate and said second upper magnetic ring;
a second lower magnetic ring, inside and coaxial with said second lower through round hole;
a second lower radial gap, between said lower magnetic conductor plate and said second lower magnetic ring; and
a common excitation coil, located between said upper magnetic conductor plate and said lower magnetic conductor plate;
wherein said first upper through round hole, said first upper magnetic ring, said first upper radial gap, said first lower round hole, said first lower magnetic ring and said first lower radial gap function as a first magnetic sub-lens module for focusing a first charged particle beam;
wherein said second upper through round hole, said second upper magnetic ring, said second upper radial gap, said second lower round hole, said second lower magnetic ring and said second lower radial gap function as a second magnetic sub-lens module for focusing a second charged particle beam;
wherein said common excitation coil provides magnetic flux to said first magnetic sub-lens module and said second magnetic sub-lens module;
wherein one of said first upper radial gap and said first lower radial gap comprises a first annular multilayer.

14. The multi-axis magnetic lens according to claim 13, wherein said first annular multilayer comprises weakly-magnetic annular layers and magnetic annular layers in alternate arrangement.

15. The multi-axis magnetic lens according to claim 14, wherein said first upper magnetic ring and said first lower magnetic ring have high magnetic permeability, one of said first upper radial gap and said first lower radial gap comprises said first annular multilayer, and the other of said first upper radial gap and said first lower radial gap is vacuum or filled with non-magnetic material.

16. The multi-axis magnetic lens according to claim 14 wherein said first upper magnetic ring and said first lower magnetic ring have high magnetic permeability, one of said first upper radial gap and said first lower radial gap comprises said first annular multilayer, and the other of said first upper radial gap and said first lower radial gap comprises a second annular multilayer, and said second annular multilayer comprises weakly-magnetic annular layers and magnetic annular layers in alternate arrangement.

17. The multi-axis magnetic lens according to claim 16, wherein said second annular multilayer, comprises a non-magnetic annular layer or a vacuum layer.

18. The multi-axis magnetic lens according to claim 14, wherein said first annular multilayer comprises a non-magnetic annular layer or a vacuum layer, and the other of said first upper radial gap and said first lower radial gap also comprises a second annular multilayer which is same as said first annular multilayer having at least one weakly-magnetic annular layer.

19. The multi-axis magnetic lens according to claim 14, wherein for said first annular multilayer, one or more but not all of said weakly-magnetic annular layers is replaced by a non-magnetic annular layer or a vacuum layer, and the other of said first upper radial gap and said first lower radial gap is vacuum or filled with non-magnetic material.

20. A permeability-discontinuity unit, comprising:
  a first plurality of annular layers, comprising at least one weakly-magnetic annular layer; and
  a second plurality of annular layers, comprising at least one magnetic annular layer;
  wherein one magnetic annular layer is immediately enclosed by one weakly-magnetic annular layer and/or immediately encloses one weakly-magnetic annular layer, and the innermost annular layer is a magnetic annular layer,
  wherein permeability of each weakly-magnetic annular layer is smaller than that of each magnetic annular layer which adjoins said weakly-magnetic annular layer.

21. The permeability-discontinuity unit according to claim 20, further comprising a non-magnetic annular layer or a vacuum layer immediately enclosed by one magnetic annular layer and/or immediately encloses one magnetic annular layer.

22. The permeability-discontinuity unit according to claim 20, wherein any weakly-magnetic annular layer can further comprise more than one weakly-magnetic sub-layers, and any magnetic layer can further comprise more than one magnetic sub-layers.

23. The permeability-discontinuity unit according to claim 22, wherein said first plurality of annular layers further comprises a non-magnetic sub-layer.

24. A permeability-discontinuity unit, comprising:
  a plurality of first annular layers with a first permeability range; and
  a plurality of second annular layers with a second permeability range, wherein said second permeability range is higher than said first permeability range;
  wherein each of said plurality of first annular layers is interleaved within said plurality of second annular layers, and an innermost annular layer is one of said second annular layers.

25. The permeability-discontinuity unit according to claim 24, wherein said first plurality of first annular layers is a non-magnetic annular layer.

* * * * *